(12) United States Patent
Kim et al.

(10) Patent No.: US 10,191,185 B2
(45) Date of Patent: Jan. 29, 2019

(54) LIGHT-EMITTING APPARATUS

(71) Applicant: LG INNOTEK CO., LTD., Seoul (KR)

(72) Inventors: Ki Cheol Kim, Seoul (KR); Chang Gyun Son, Seoul (KR); Kang Yeol Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 509 days.

(21) Appl. No.: 14/935,543

(22) Filed: Nov. 9, 2015

(65) Prior Publication Data

US 2016/0131336 A1    May 12, 2016

(30) Foreign Application Priority Data

Nov. 11, 2014 (KR) .................. 10-2014-0156034

(51) Int. Cl.
*F21V 13/04* (2006.01)
*G02B 1/02* (2006.01)
(Continued)

(52) U.S. Cl.
CPC ............... *G02B 1/02* (2013.01); *F21S 41/14* (2018.01); *F21S 41/285* (2018.01); *F21S 41/36* (2018.01); *F21S 43/13* (2018.01); *F21S 43/26* (2018.01); *F21S 43/31* (2018.01); *F21S 43/40* (2018.01); *F21S 48/1145* (2013.01); *F21S 48/1225* (2013.01); *F21S 48/1388* (2013.01); *F21S 48/214* (2013.01); *F21S 48/2212* (2013.01); *F21S 48/234* (2013.01); *F21S 48/24* (2013.01);
(Continued)

(58) Field of Classification Search
CPC ... G02B 1/02; F21S 43/13; F21S 43/40; F21S 43/14; F21S 43/36; F21S 43/31; F21S 43/285; F21S 43/26; F21S 48/1145; F21S 48/1225; F21S 48/1388; F21S 48/214; F21S 48/2212; F21S 48/234; F21S 48/24
See application file for complete search history.

(56) References Cited

U.S. PATENT DOCUMENTS 7,559,672 B1 * 7/2009 Parkyn .................. A47B 97/00
362/127
7,857,619 B2 * 12/2010 Liu .......................... G02B 3/08
359/622
(Continued)

FOREIGN PATENT DOCUMENTS

CN    102759015 A    10/2012
CN    102853330 A     1/2013
(Continued)

OTHER PUBLICATIONS

Extended European Search Report for Application No. 15192896.7.
(Continued)

*Primary Examiner* — Anabel Ton
(74) *Attorney, Agent, or Firm* — LRK Patent Law Firm

(57) ABSTRACT

Embodiments provide a light-emitting apparatus including at least one light source, a wavelength converter configured to convert a wavelength of light emitted from the light source, a first lens configured to face a light emission surface of the wavelength converter, and a rounded reflector spaced apart from the first lens, the reflector being configured to reflect light emitted from the first lens.

19 Claims, 20 Drawing Sheets

(51) Int. Cl.

| | | |
|---|---|---|
| *F21S 43/31* | (2018.01) | |
| *F21S 43/13* | (2018.01) | |
| *F21S 41/20* | (2018.01) | |
| *F21S 43/20* | (2018.01) | |
| *F21S 41/14* | (2018.01) | |
| *F21S 43/40* | (2018.01) | |
| *F21S 41/36* | (2018.01) | |
| *H01L 33/60* | (2010.01) | |
| *F21S 41/147* | (2018.01) | |
| *F21S 45/42* | (2018.01) | |
| *F21S 45/47* | (2018.01) | |
| *F21S 8/10* | (2006.01) | |
| *H01L 33/50* | (2010.01) | |
| *F21Y 115/30* | (2016.01) | |

(52) U.S. Cl.
CPC ............ *H01L 33/60* (2013.01); *F21S 41/147* (2018.01); *F21S 45/42* (2018.01); *F21S 45/47* (2018.01); *F21S 48/1159* (2013.01); *F21S 48/323* (2013.01); *F21S 48/328* (2013.01); *F21Y 2115/30* (2016.08); *H01L 33/507* (2013.01)

(56) References Cited

U.S. PATENT DOCUMENTS

| 8,858,048 | B2* | 10/2014 | Nakazato | F21S 41/125 |
| | | | | 362/510 |
| 9,441,155 | B2* | 9/2016 | Kishimoto | C09K 11/7774 |
| 2001/0055209 | A1* | 12/2001 | Dedoro | F21S 10/007 |
| | | | | 362/293 |
| 2004/0174712 | A1 | 9/2004 | Yagi | |
| 2004/0184280 | A1 | 9/2004 | Ishida et al. | |
| 2005/0122736 | A1 | 6/2005 | Watanabe et al. | |
| 2005/0190563 | A1* | 9/2005 | Li | F21V 5/045 |
| | | | | 362/332 |
| 2007/0064174 | A1* | 3/2007 | Kitamura | G02B 3/0056 |
| | | | | 349/69 |
| 2008/0080572 | A1 | 4/2008 | Kamijima | |
| 2010/0246176 | A1* | 9/2010 | Shyu | F21V 5/007 |
| | | | | 362/235 |
| 2012/0182755 | A1* | 7/2012 | Wildner | G09F 9/301 |
| | | | | 362/555 |
| 2012/0287375 | A1* | 11/2012 | Matsuki | G02B 19/0066 |
| | | | | 349/64 |
| 2013/0215634 | A1 | 8/2013 | Tseng | |
| 2015/0369437 | A1* | 12/2015 | Reinprecht | F21S 48/1225 |
| | | | | 362/510 |
| 2017/0023199 | A1* | 1/2017 | Hamada | H01L 33/501 |
| 2017/0350568 | A1* | 12/2017 | Hager | F21S 41/24 |

FOREIGN PATENT DOCUMENTS

| CN | 202938102 U | 5/2013 |
| EP | 1447616 A2 | 11/2004 |
| EP | 2525140 A2 | 5/2012 |
| EP | 2541129 A2 | 6/2012 |
| JP | 2003-031011 A | 1/2003 |
| JP | 2013-066899 A | 4/2013 |
| TW | 201334996 A | 9/2013 |
| WO | 2014-121707 A | 8/2014 |

OTHER PUBLICATIONS

SIPO Office Action, dated Aug. 13, 2018 for Chinese Patent Application No. 201510767183.4 which corresponds to the above-identified U.S. application.

\* cited by examiner

FIG. 3
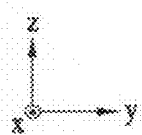

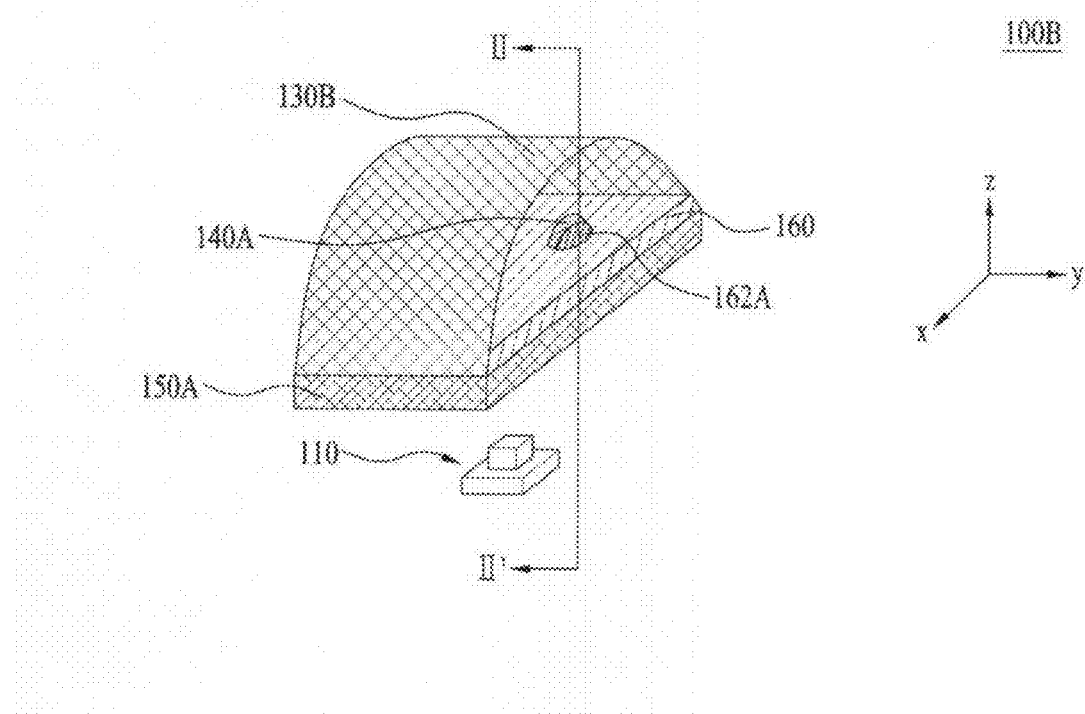

LIGHT-EMITTING APPARATUS

CROSS REFERENCE TO RELATED APPLICATION

This application claims priority under 35 U.S.C. § 119 to Korean Patent Application No. 10-2014-0156034, filed on Nov. 11, 2014, which is hereby incorporated in its entirety by reference as if fully set forth herein.

BACKGROUND OF THE INVENTION

1. Field of the Invention

Embodiments relate to a light-emitting apparatus.

2. Description of Related Art

Semiconductor Light-Emitting Diodes (LEDs) are semiconductor devices that convert electricity into infrared light or ultraviolet light using the characteristics of compound semiconductors so as to enable transmission/reception of signals, or that are used as a light source.

Group III-V nitride semiconductors are in the spotlight as core materials of light emitting devices such as, for example, LEDs or Laser Diodes (LDs) due to physical and chemical characteristics thereof.

The LEDs or LDs do not include environmentally harmful materials such as mercury (Hg) that are used in conventional lighting appliances such as, for example, fluorescent lamps and incandescent bulbs, and thus are very eco-friendly, and have several advantages such as, for example, long lifespan and low power consumption. As such, conventional light sources are being rapidly replaced with LEDs or LDs.

In particular, the fields in which these light-emitting devices are used are expanding. A light-emitting apparatus including light-emitting devices needs to have, for example, excellent light extraction efficiency and radiation effects.

SUMMARY

Embodiments provide a light-emitting apparatus having improved reliability owing to excellent light extraction efficiency and radiation effects.

In one embodiment, a light-emitting apparatus includes at least one light source, a wavelength converter configured to convert a wavelength of light emitted from the light source, a first lens configured to face a light emission surface of the wavelength converter, and a rounded reflector spaced apart from the first lens, the reflector being configured to reflect light emitted from the first lens.

For example, at least a portion of the first lens may be disposed to face the reflector with an air layer interposed therebetween.

For example, the light-emitting apparatus may further include a base substrate configured to support the reflector, the wavelength converter and the first lens being disposed on the base substrate.

For example, the base substrate may include a first area, and a second area adjacent to the first area, the wavelength converter being disposed in the second area.

For example, the light-emitting apparatus may further include a first reflective layer disposed in the first area of the base substrate.

For example, the second area of the base substrate may include a first through-hole for introduction of the light emitted from the light source, and the wavelength converter is disposed in the first through-hole.

For example, the reflector may include a second through-hole for introduction of the light emitted from the light source. The second area of the base substrate may include a recess for arrangement of the wavelength converter.

For example, the light-emitting apparatus may further include a second reflective layer disposed to face a portion of an upper surface of the first lens, the portion being not opposite to the reflector.

For example, the second reflective layer may be disposed on the portion of the upper surface of the first lens. The second reflective layer may be a film or a sheet attached to, or a coating applied to the upper surface of the first lens. Alternatively, the second reflective layer may be spaced apart from the first lens.

For example, the light-emitting apparatus may further include a beam-forming part disposed on a portion from which the light reflected by the reflector is emitted. The beam-forming part may include at least one of a Fresnel lens, a freeform lens, or a conic lens.

For example, the light-emitting apparatus may further include an anti-reflective film disposed on a portion from which the light reflected by the reflector is emitted.

For example, the light source may include at least one of light-emitting diodes or laser diodes.

For example, the light source, the wavelength converter, and the first lens may be arranged along an optical axis.

For example, the wavelength converter may have a first index of refraction and the first lens may have a second index of refraction, and a ratio of the second index of refraction to the first index of refraction may be 0.6 or more.

For example, the first lens may have a semispherical shape.

For example, the light-emitting apparatus may further include an adhesive part disposed between the first lens and the wavelength converter. The adhesive part may include at least one of sintered or fired polymer, $Al_2O_3$, or $SiO_2$.

For example, the at least one light source may include a plurality of light sources, and the light-emitting apparatus may further include a circuit board for mounting of the light sources.

For example, the light-emitting apparatus may further include a radiator attached to at least one of a rear surface or a side surface of the circuit board, or a rear surface or a side surface of the base substrate.

For example, a surface of the circuit board for the mounting of the light sources may be a flat surface, a curved surface, or a spherical surface.

For example, the at least one light source may include a plurality of light sources, and the light-emitting apparatus may further include a second lens configured to focus the light emitted from the light sources so as to emit the light to the first or second through-hole.

For example, the light-emitting apparatus may further include a first mirror disposed between the second lens and the first or second through-hole, the first mirror being configured to reflect the light emitted from the second lens to the first or second through-hole.

For example, the light-emitting apparatus may further include a prism, a second mirror, or a dichroic coating layer disposed between the light sources and the second lens.

For example, the wavelength converter may have a first width and a bottom surface of the first lens may have a first width in a direction perpendicular to an optical axis, and a ratio of the first width of the wavelength converter to the first width of the bottom surface of the first lens may be within a range from 0.001 to 1.

For example, the first lens may comprise at least one of $Al_2O_3$ single crystals and $Al_2O_3$ or $SiO_2$ glass. The first lens may have a thermal conductivity coefficient within a range from 1 W/mK to 50 W/mK, and a reference temperature may be within a range from 20K to 400K.

BRIEF DESCRIPTION OF THE DRAWINGS

Arrangements and embodiments may be described in detail with reference to the following drawings in which like reference numerals refer to like elements and wherein:

FIG. 3 is an exploded sectional view of the light-emitting apparatus illustrated in FIG. 2;

FIG. 6 is a perspective view of a light-emitting apparatus according to another embodiment;

DESCRIPTION OF SPECIFIC EMBODIMENTS

Figure 1:
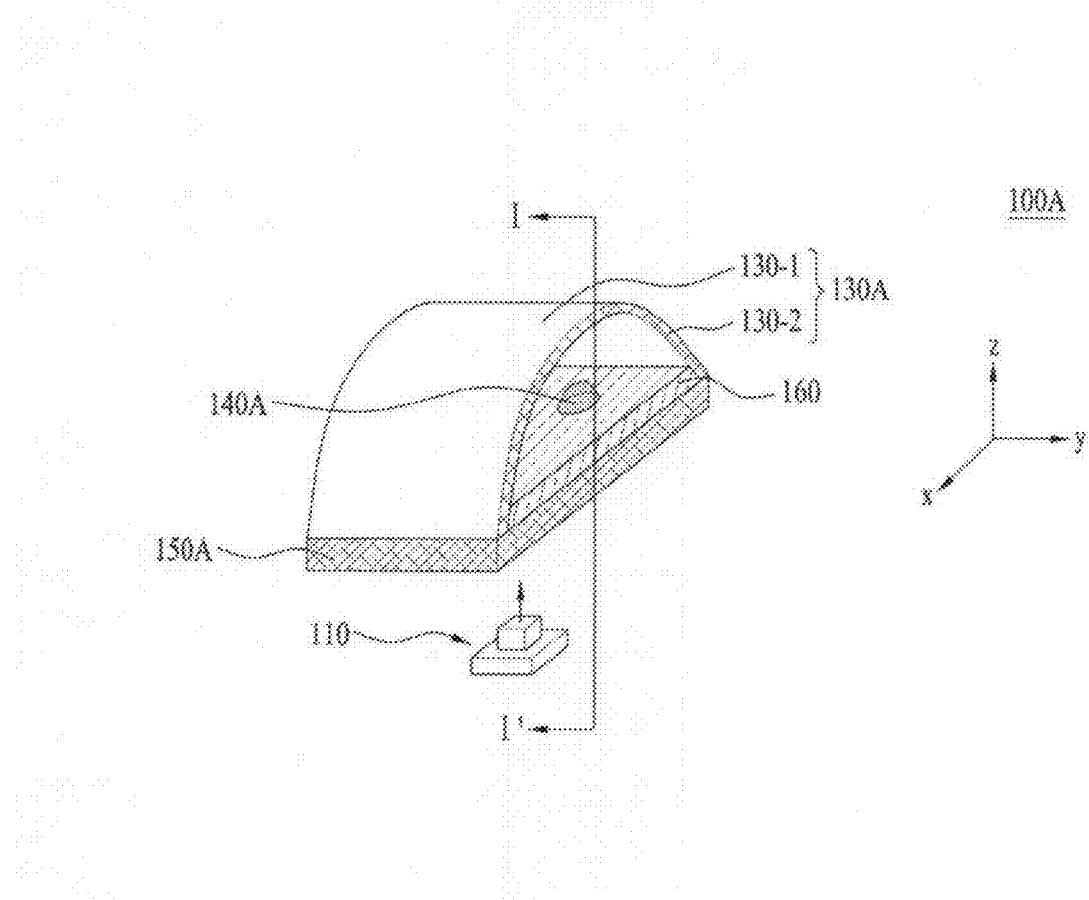
FIG. 1 is a perspective view of a light-emitting apparatus according to one embodiment.

Hereinafter, exemplary embodiments will be described in detail with reference to the accompanying drawings to aid in understanding of the embodiments. However, the embodiments may be altered in various ways, and the scope of the embodiments should not be construed as limited to the following description. The embodiments are intended to provide those skilled in the art with more complete explanation.

In the following description of the embodiments, it will be understood that, when each element is referred to as being formed "on" or "under" the other element, it can be directly "on" or "under" the other element or be indirectly formed with one or more intervening elements therebetween. In addition, it will also be understood that "on" or "under" the element may mean an upward direction and a downward direction of the element.

In addition, the relative terms "first", "second", "upper", "lower" and the like in the description and in the claims may be used to distinguish between any one substance or element and other substances or elements and not necessarily for describing any physical or logical relationship between the substances or elements or a particular order.

In the drawings, the thickness or size of each layer (or each portion) may be exaggerated, omitted or schematically illustrated for clarity and convenience. In addition, the size of each constituent element does not wholly reflect an actual size thereof.

Hereinafter, light-emitting apparatuses 100A to 100I according to the embodiments will be described with reference to the accompanying drawings. For convenience, although the light-emitting apparatuses 100A to 100I will be described using the Cartesian coordinate system (comprising the x-axis, the y-axis, and the z-axis), of course, it may be described using other coordinate systems. In addition, although the x-axis, the y-axis, and the z-axis in the Cartesian coordinate system are perpendicular to one another, the embodiments are not limited thereto. That is, the x-axis, the y-axis, and the z-axis may cross one another, rather than being perpendicular to one another.

Figure 2:
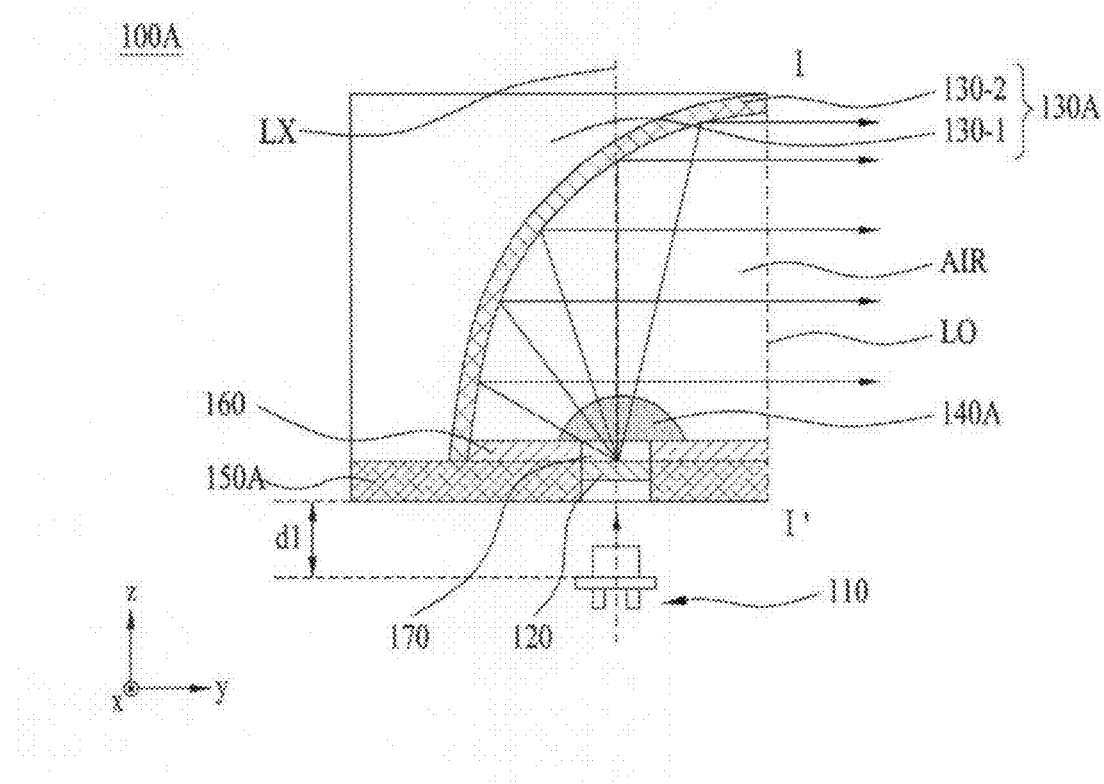
FIG. 2 is a sectional view taken along line I-I' of the light-emitting apparatus illustrated in FIG. 1.

FIG. 1 is a perspective view of a light-emitting apparatus 100A according to one embodiment, FIG. 2 is a sectional view taken along line I-I' of the light-emitting apparatus 100A illustrated in FIG. 1, and FIG. 3 is an exploded sectional view of the light-emitting apparatus 100A illustrated in FIG. 2.

The light-emitting apparatus 100A of one embodiment may include at least one light source 110, a wavelength converter 120, a reflector 130A, a first lens 140A, a base substrate 150A, a first reflective layer 160, and a first adhesive part 170.

The light source 110 serves to emit light. Although the light source 110 may include at least one of Light-Emitting Diodes (LEDs) or Laser Diodes (LDs), the embodiment is not limited as to the kind of the light source 110.

Generally, the viewing angle of LEDs is wider than the viewing angle of LDs. Thus, LDs having a narrower viewing angle than LEDs may be advantageous in terms of the introduction of light into a first through-hole PT1. However, in the case where an optical system (not illustrated) capable of reducing the viewing angle is located between the light source 110, i.e. the LEDs and the first through-hole PT1, the optical system may reduce the viewing angle of light emitted from the LEDs so as to introduce the light into the first through-hole PT1. As such, the LEDs may be used as the light source 110.

In the case of FIG. 1, although only one light source 110 is illustrated, the embodiment is not limited as to the number of light sources 110. That is, a plurality of light sources 110 may be provided. Examples of the light sources 110 will be described below with reference to FIGS. 16 to 19.

In addition, although the light emitted from the light source 110 may have any peak wavelength in the wavelength band from 400 nm to 500 nm, the embodiment is not limited as to the wavelength band of the emitted light. The light source 110 may emit light having a Spectral Full Width at Half Maximum (SFWHM) of 10 nm or less. The SFWHM corresponds to the width of a wavelength depending on intensity. However, the embodiment is not limited to any specific value of the SFWHM. In addition, although the FWHM of light, emitted from the light source 110 and introduced into the wavelength converter 120, i.e. the size of light beams may be 1 nm or less, the embodiment is not limited thereto.

The light source 110 may be spaced apart from the wavelength converter 120 (or the first through-hole PT1) by a first distance d1. When the first distance d1 is small, the wavelength converter 120 and/or the base substrate 150A may be affected by heat generated from the light source 110. Therefore, although the first distance d1 may be 10 μm or more, the embodiment is not limited thereto.

Meanwhile, the wavelength converter 120 may convert the wavelength of the light emitted from the light source 110. While the light emitted from the light source 110 is introduced into the first through-hole PT1 and passes through the wavelength converter 120, the wavelength of the light may vary. However, not all of the light that has passed through the wavelength converter 120 may be wavelength-converted light.

As the wavelength of the light emitted from the light source 110 is converted by the wavelength converter 120, white light or light having a desired color temperature may be emitted from a light emission surface LO of the light-emitting apparatus 100A. To this end, the wavelength converter 120 may include phosphors, for example, at least one of ceramic phosphors, lumiphors, or YAG single-crystals. Here, the term "lumiphors" means a luminescent material or a structure including a luminescent material.

In addition, light having a desired color temperature may be emitted from the light-emitting apparatus 100A via adjustment in, for example, the concentration, particle size, and particle-size distribution of various materials included in the wavelength converter 120, the thickness of the wavelength converter 120, the surface roughness of the wavelength converter 120, and air bubbles. For example, the wavelength converter 120 may convert the wavelength band of light having a color temperature within a range from 3000K to 9000K. That is, although the light, the wavelength of which has been converted by the wavelength converter 120, may be within the color temperature range from 3000K to 9000K, the embodiment is not limited thereto.

The wavelength converter 120 may be any of various types. For example, the wavelength converter 120 may be any of three types, i.e. a Phosphor-In-Glass (PIG) type, a polycrystalline type (or ceramic type), and a single-crystalline type.

In addition, a light transmitting medium may further be disposed in a path along which the light emitted from the light source 110 is directed to the wavelength converter 120. That is, the light transmitting medium may be disposed between the light source 110 and the first through-hole PT1 (or the wavelength converter 120). The light transmitting layer medium may include a medium, the index of refraction of which is 1, the same as that of air, or may include a medium, the index of refraction of which is greater than 1 and equal to or less than 2.

The wavelength converter 120 may be disposed on the base substrate 150A. The base substrate 150A may include a first area A1 and a second area A2. The first area A1 of the base substrate 150A may be defined as the area excluding the second area A2. The second area A2 of the base substrate 150A may be defined as the area that is adjacent to the first area A1 and supports the wavelength converter 120 disposed thereon. The second area A2 of the base substrate 150A may include the first through-hole PT1, into which the light emitted from the light source 110 is introduced. The wavelength converter 120 may be disposed in the first through-hole PT1 of the second area A2 of the base substrate 150A.

Meanwhile, the first lens 140A may be disposed on the base substrate 150A, and may be disposed to be opposite to the reflector 130A with an air layer AIR interposed therebetween. The first lens 140A may refract the light emitted from the wavelength converter 120. Alternatively, when the light reflected from the reflector 130A is introduced into the first lens 140A, the first lens 140A may again refract the light. To this end, the first lens 140A may be disposed so as to face the light emission surface of the wavelength converter 120.

For example, although the light source 110, the wavelength converter 120, and the first lens 140A may be arranged along the optical axis LX as exemplarily illustrated in FIG. 2, the embodiment is not limited thereto.

The light emitted from the light source 110 is introduced through the first through-hole PT1, and thereafter passes through the wavelength converter 120. Thereafter, when the wavelength converter 120 and the first lens 140A have the difference in the index of refraction, the light may be refracted in the first lens 140A.

The smaller the difference Δn between the first index of refraction n1 of the wavelength converter 120 and the second index of refraction n2 of the first lens 140A, the greater the improvement in the light extraction efficiency of the light-emitting apparatus 100A. However, when the difference Δn between the first and second indices of refraction n1 and n2 is large, the improvement in the light extraction efficiency of the light-emitting apparatus 100A may be reduced.

The following Table 1 represents the relationship between the difference Δn between the first index of refraction n1 and the second index of refraction n2 and light extraction efficiency.

TABLE 1

| n1 | n2 | Δn | Ext(%) | ΔExt(%) |
|---|---|---|---|---|
| 1.4 | 1.0 | 0.4 | 30.01 | 0.00 |
|  | 1.1 | 0.3 | 38.14 | 8.13 |
|  | 1.2 | 0.2 | 48.49 | 18.48 |
|  | 1.3 | 0.1 | 62.88 | 32.87 |
|  | 1.4 | 0 | 100.00 | 69.99 |
| 1.6 | 1.0 | 0.6 | 21.94 | 0.00 |
|  | 1.1 | 0.5 | 27.38 | 5.44 |
|  | 1.2 | 0.4 | 33.86 | 11.92 |
|  | 1.3 | 0.3 | 41.70 | 19.77 |
|  | 1.4 | 0.2 | 51.59 | 29.65 |
|  | 1.5 | 0.1 | 65.20 | 43.26 |
|  | 1.6 | 0 | 100.00 | 78.06 |
| 1.8 | 1.0 | 0.8 | 16.85 | 0.00 |
|  | 1.1 | 0.7 | 20.85 | 3.99 |
|  | 1.2 | 0.6 | 25.46 | 8.61 |
|  | 1.3 | 0.5 | 30.83 | 13.98 |
|  | 1.4 | 0.4 | 37.15 | 20.29 |
|  | 1.5 | 0.3 | 44.72 | 27.87 |
|  | 1.6 | 0.2 | 54.19 | 37.34 |
|  | 1.7 | 0.1 | 67.13 | 50.28 |
|  | 1.8 | 0 | 100.00 | 83.15 |
| 2.0 | 1.0 | 1.0 | 13.40 | 0.00 |
|  | 1.1 | 0.9 | 16.48 | 3.09 |
|  | 1.2 | 0.8 | 20.00 | 6.60 |

TABLE 1-continued

| n1 | n2 | Δn | Ext(%) | ΔExt(%) |
|---|---|---|---|---|
| | 1.3 | 0.7 | 24.01 | 10.61 |
| | 1.4 | 0.6 | 28.59 | 15.19 |
| | 1.5 | 0.5 | 33.86 | 20.46 |
| | 1.6 | 0.4 | 40.00 | 26.60 |
| | 1.7 | 0.3 | 47.32 | 33.92 |
| | 1.8 | 0.2 | 56.41 | 43.01 |
| | 2.0 | 0 | 100.00 | 86.60 |

Here, Ext is light extraction efficiency, and ΔExt is variation in light extraction efficiency Ext.

Referring to Table 1, it can be appreciated that light extraction efficiency increases as the difference Δn between the first and second indices of refraction n1 and n2 decreases. Thus, although the difference Δn between the first and second indices of refraction n1 and n2 may be zero (when the first and second indices of refraction n1 and n2 are the same), the embodiment is not limited thereto. To this end, the wavelength converter 120 and the first lens 140A may be integrated with each other.

In addition, the second index of refraction n2 of the first lens 140A may be changed according to the first index of refraction n1 of the wavelength converter 120. When the wavelength converter 120 is a PIG type, the first index of refraction n1 may be within a range from 1.3 to 1.7. When the wavelength converter 120 is a polycrystalline type, the first index of refraction n1 may be within a range from 1.5 to 2.0. When the wavelength converter 120 is a single-crystalline type, the first index of refraction n1 may be within a range from 1.5 to 2.0. As such, although the first index of refraction n1 may be within a range from 1.3 to 2.0, the embodiment is not limited thereto.

Figure 4A:
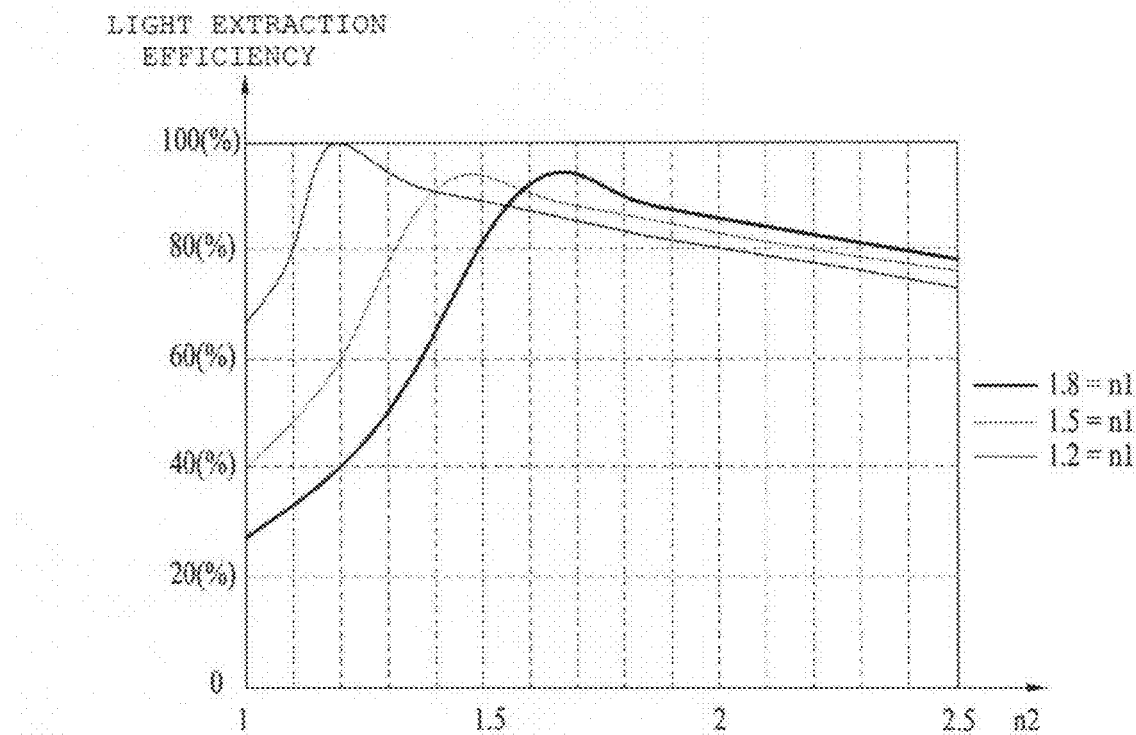
FIG. 4A is a graph illustrating light extraction efficiency depending on the first index of refraction of a wavelength converter and the second index of refraction of a first lens.
Figure 4B:
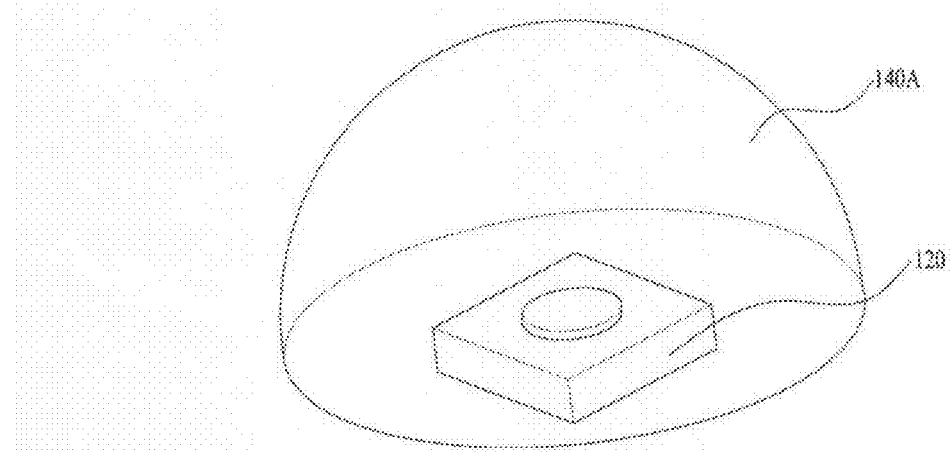
FIG. 4B is a view illustrating the first lens disposed on the wavelength converter.

FIG. 4A is a graph illustrating light extraction efficiency depending on the first index of refraction n1 of the wavelength converter 120 and the second index of refraction n2 of the first lens 140A, and FIG. 4B is a view illustrating the first lens 140A disposed on the wavelength converter 120. In FIG. 4A, the horizontal axis represents the second index of refraction n2 of the first lens 140A, and the vertical axis represents the light extraction efficiency.

As exemplarily illustrated in FIG. 4B, when the first lens 140A is formed into a semispherical shape and the ratio of the second index of refraction n2 of the first lens 140A to the first index of refraction n1 of the wavelength converter 120 is 0.6 or more, it can be appreciated that light extraction efficiency is improved by 40% or more compared to the case where the first lens 140A is not included in the light-emitting apparatus 100A. This improvement in light extraction efficiency may be measured via total luminous flux in both cases where the first lens 140A is included and where the first lens 140A is not included.

The first lens 140A may comprise at least one of $Al_2O_3$ single-crystals, $Al_2O_3$, or $SiO_2$ glass. As described above, the material of the first lens 140A may be selected to have a second index of refraction n2 having a small difference Δn with the first index of refraction n1.

In addition, when the first lens 140A has high thermal conductivity, the first lens 140A may advantageously radiate heat generated from the wavelength converter 120. The thermal conductivity may be changed based on the kind of material and the reference temperature (i.e. the temperature of the surrounding environment). In consideration thereof, the first lens 140A may comprise a material having thermal conductivity within a range from 1 W/mK to 50 W/mK and/or having a reference temperature within a range from 20K to 400K.

As described above, the material of the first lens 140A may be determined in consideration of the fact that light extraction efficiency and heat radiation are determined based on the kind of material of the first lens 140A.

In addition, the illuminance distribution and the light extraction efficiency of the light emitted through the light emission surface LO may be changed based on the shape (or form) of the first lens 140A. Thus, the first lens 140A having any of various shapes may be used, based on the desired illuminance distribution of light emitted through the light emission surface LO. For example, the first lens 140A may have at least one of a spherical shape, an aspherical shape, a freeform curved shape, a hyperbolic shape, an elliptical shape, or a Fresnel lens shape.

Figure 5A:
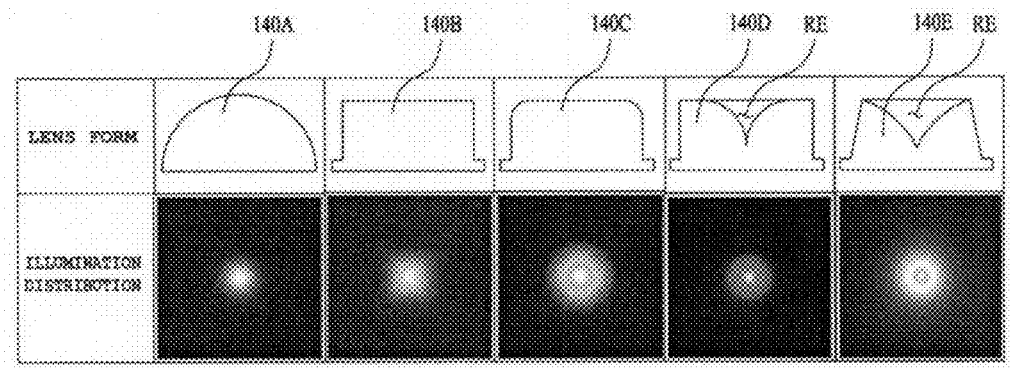
FIG. 5A is a graph illustrating illuminance distribution depending on the form of the first lens.
Figure 5B:
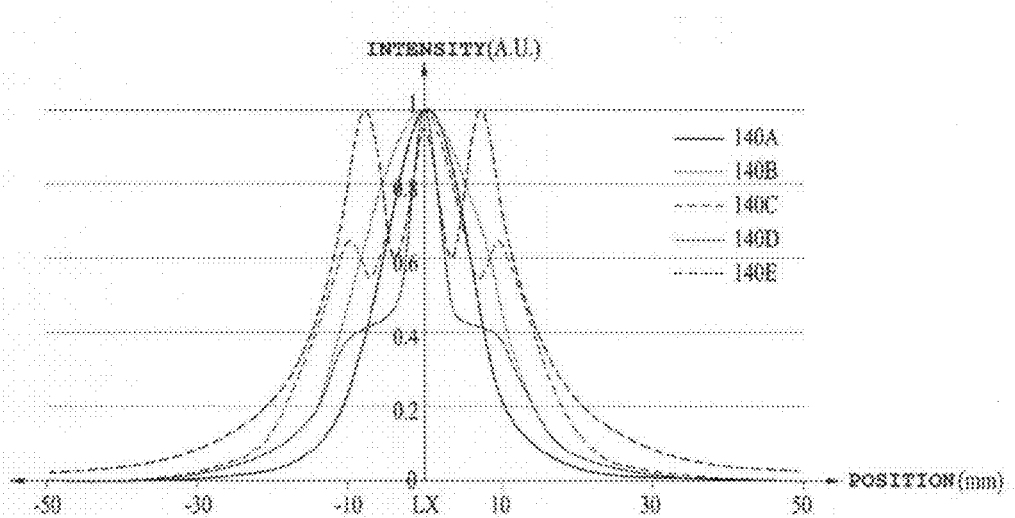
FIG. 5B is a graph illustrating intensity depending on the position of the lens about the optical axis.

FIG. 5A is a view illustrating illuminance distribution depending on the form of the first lens 140A, and FIG. 5B is a graph illustrating the maximum value of intensity depending on the position of the lens about the optical axis LX, the intensity being normalized to "1" and illustrated depending on the form of each lens as illustrated in FIG. 5A.

Referring to FIG. 5A, the cases where the first lens has a semispherical shape 140A and any of various other shapes 140B to 140E are illustrated. In particular, the lenses 140D and 140E illustrated in FIG. 5A may further include a recess RE formed along the optical axis LX. At this time, various illumination distributions corresponding to the respective shapes 140A, 140B, 140C, 140D and 140E can be observed.

In addition, when the ratio RAT of the second width W2 of the wavelength converter 120 to the first width W1 of the bottom surface 140b of the first lens 140A in the direction (e.g. the y-axis) perpendicular to the optical axis LX is below 0.001, light having the wavelength converted by the wavelength converter 120 may not be used as a lighting. In addition, when the ratio RAT is greater than 1, most light spreads widely to thereby be emitted from the light-emitting apparatus 100A. Accordingly, although the ratio RAT may be within a range from 0.001 to 1 according to the application of the light-emitting apparatus, the embodiment is not limited thereto.

Meanwhile, the base substrate 150A may support the reflector 130A. The reflector 130A may be disposed to be spaced apart from the first lens 140A and may reflect light emitted from the first lens 140A. At this time, the reflector 130A may reflect light, the wavelength of which has been converted in the wavelength converter 120, as well as light, the wavelength of which has not been converted in the wavelength converter 120. To this end, although the reflector 130A may have a round (or parabolic) cross-sectional shape, the embodiment is not limited thereto. When the reflector 130A has a round (or parabolic) shape, this may be advantageous for the collimation of light emitted through the imaginary light emission surface LO.

The reflector 130A may include at least one selected, based on desired illuminance distribution, from an aspherical surface, a freeform curved surface, a Fresnel lens, and a Holography Optical Element (HOE). Here, the freeform curved surface may be a form provided with curvilinear surfaces in various shapes.

When the Fresnel lens is used as the reflector 130A, the Fresnel lens may serve as a reflector 130A that reflects light, the wavelength of which has been converted in the wavelength converter 120, as well as light, the wavelength of which has not been converted.

In addition, the reflector 130A may include a body 130-1 and a reflective film 130-2. The reflective film 130-2 may be a film or a sheet attached to, or a coating applied to the body 130-1. For example, the reflective film 130-2 may be formed by coating the body 130-1 with a metal.

In addition, the first reflective layer 160 may further be disposed on the first area A1 of the base substrate 150A. Although the first reflective layer 160 may take the form of a film or a coating attached to the first area A1 of the base substrate 150A, the embodiment is not limited as to the manner in which the first reflective layer 160 is disposed.

In the case where the first reflective layer 160 is provided, light, which is directed to the base substrate 150A rather than being emitted through the light emission surface LO after being reflected by the reflector 130A, may be reflected by the first reflective layer 160 so as to be introduced into the first lens 140A, or so as to be directed to the reflector 130A, which may allow a greater amount of light to be emitted through the light emission surface LO. That is, the light extraction efficiency of the light-emitting apparatus 100A may be improved.

When the reflector 130A or the first reflective layer 160 has a reflectance below 60%, the reflection role thereof cannot be properly performed. Thus, although the reflectance of the reflector 130A or the first reflective layer 160 may be within a range from 60% to 100%, the embodiment is not limited thereto. In some cases, the first reflective layer 160 may be omitted.

In addition, referring again to FIGS. 2 and 3, the adhesive part 170 may be disposed between the bottom surface 140b of the first lens 140A and the wavelength converter 120. At this time, the adhesive part 170 may comprise at least one of sintered or fired polymer, $Al_2O_3$, or $SiO_2$. As such, although the first lens 140A and the wavelength converter 120 may be bonded to each other via the adhesive part 170, the embodiment is not limited thereto.

For example, when the first lens 140A and the wavelength converter 120 are fabricated separately, the first lens 140A and the wavelength converter 120 may be bonded to each other via various methods.

In one example, when powder such as, for example, $Al_2O_3$ or $SiO_2$ glass, or polymer, such as silicon, is applied evenly and thinly to the bonding region of the wavelength converter 120 and the first lens 140A, and then the wavelength converter 120 and the first lens 140A are subjected to sintering or firing, the two 120 and 140A may be bonded to each other. At this time, the adhesive part 170 may be present between the two 120 and 140A.

In addition, after one of the first lens 140A and the wavelength converter 120 is first fabricated, the one that is fabricated first may be used as a substrate for the other one to be subsequently fabricated. For example, when the first lens 140A is fabricated first, the flat surface of the lens 140A that is fabricate first may be used as a substrate, such that the wavelength converter 120 may be fabricated on the substrate.

Alternatively, a jig may be used to fabricate the wavelength converter 120 and the first lens 140A at the same time.

Figure 7:
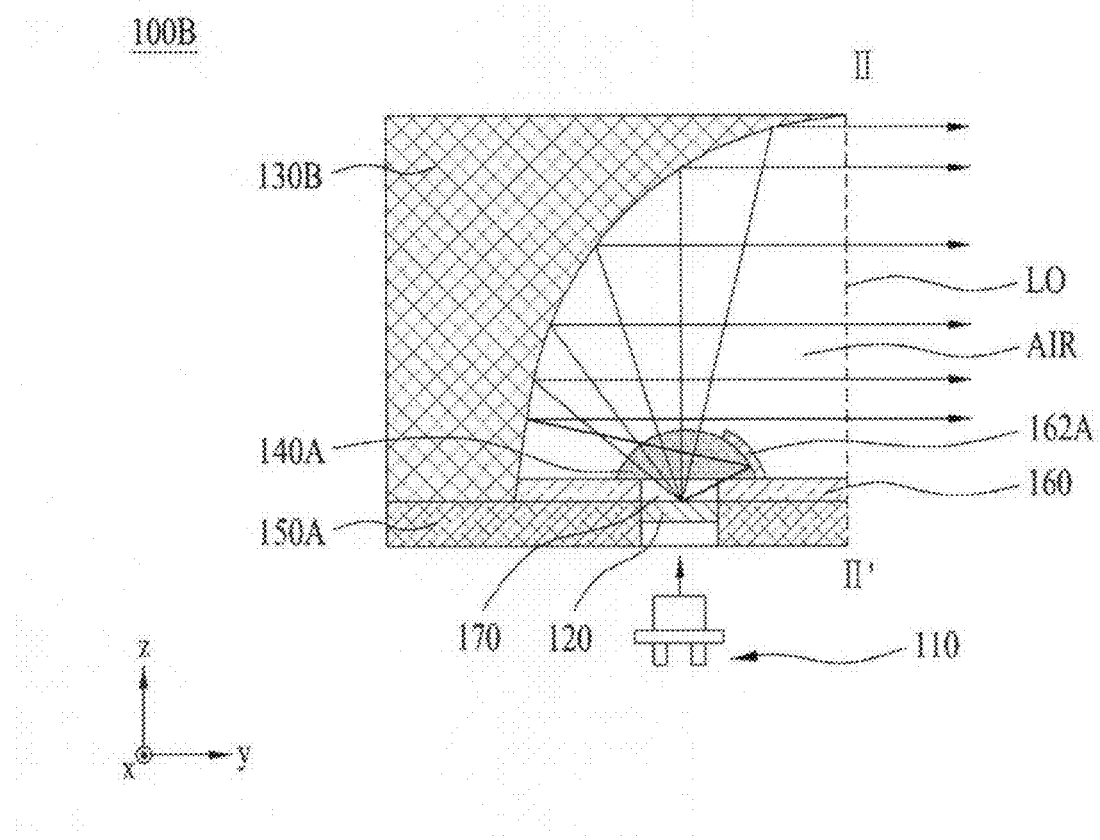
FIG. 7 is a sectional view taken along line II-II of the light-emitting apparatus illustrated in FIG. 6.
Figure 8:
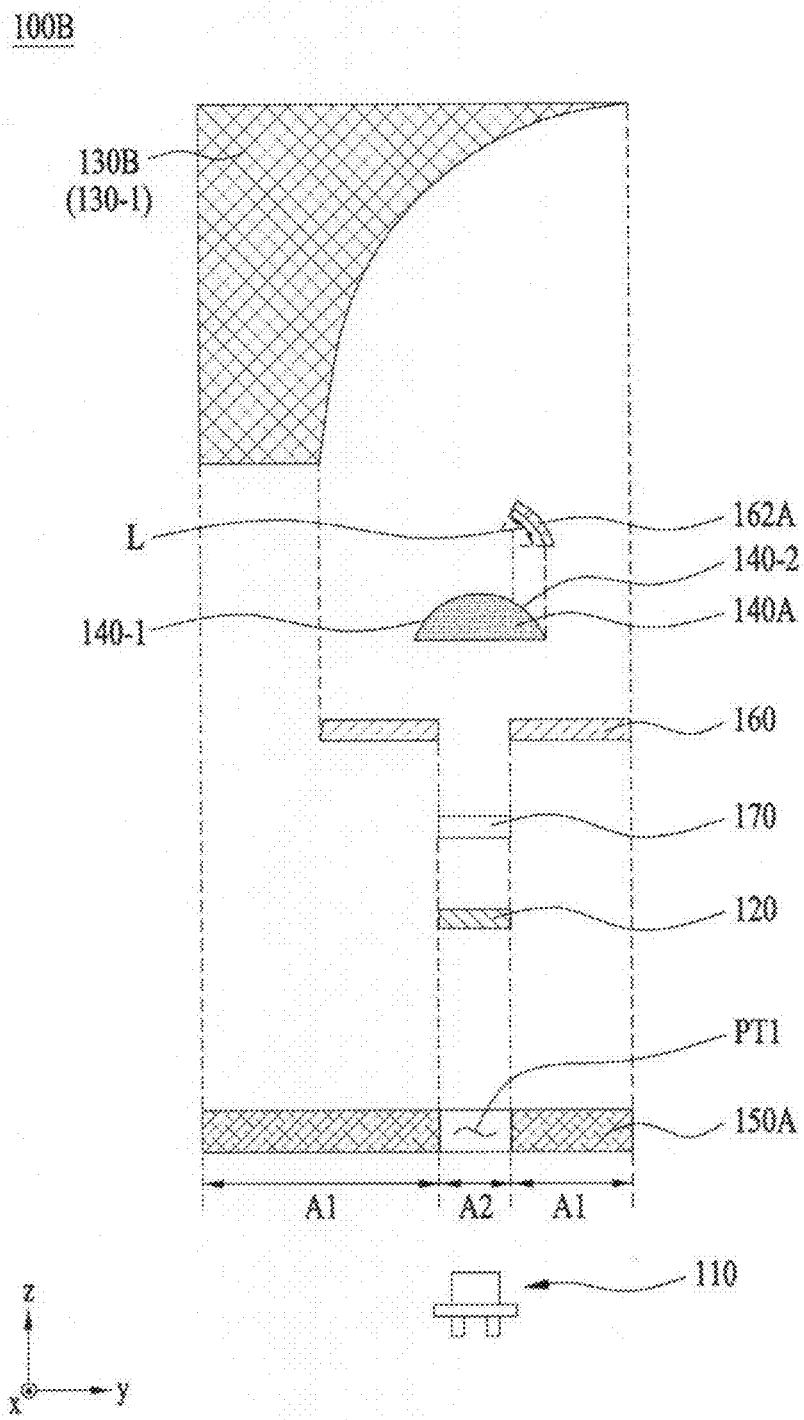
FIG. 8 is an exploded sectional view of the light-emitting apparatus illustrated in FIG. 7.

FIG. 6 is a perspective view of a light-emitting apparatus 100B according to another embodiment, FIG. 7 is a sectional view taken along line II-II of the light-emitting apparatus 100B illustrated in FIG. 6, and FIG. 8 is an exploded sectional view of the light-emitting apparatus 100B illustrated in FIG. 7.

The light-emitting apparatus 100B according to another embodiment may include the light source 110, the wavelength converter 120, a reflector 130B, the first lens 140A, the substrate 150A, the first and second reflective layers 160 and 162A, and the adhesive part 170.

The light source 110, the wavelength converter 120, the first lens 140A, the substrate 150A, the first reflective layer 160, and the adhesive part 170 illustrated in FIGS. 6 to 8 respectively correspond to the light source 110, the wavelength converter 120, the first lens 140A, the substrate 150A, the first reflective layer 160, and the adhesive part 170 illustrated in FIGS. 1 to 3, and thus the same parts are designated by the same reference numerals and a repeated description thereof will be omitted below.

Referring to FIG. 8, at least a portion 140-1 of the first lens 140A may be disposed to face the reflector 130B with the air layer AIR interposed therebetween. At this time, an opposite portion 140-2 of the first lens 140A is the portion that does not face the reflector 130A, and light may be emitted through the light emission surface LO from the opposite portion 140-2, rather than being reflected by the reflector 130B. As described above, this may have a negative effect on the collimation of the light emitted through the light emission surface LO.

To solve this problem, the light-emitting apparatus 100B illustrated in FIGS. 6 to 8 may further include a second reflective layer 162A, unlike the light-emitting apparatus 100A illustrated in FIGS. 1 to 3. The second reflective layer 162A may be disposed to be opposite to the reflector 130B with the first lens 140A interposed therebetween. The second reflective layer 162A may be disposed so as to face the portion 140-2 of the upper surface of the first lens 140A, the portion 140-2 being the portion that is not opposite to the reflector 130B.

At this time, the second reflective layer 162A may not be disposed on the portion 140-1 of the upper surface of the first lens 140A, which is opposite to the reflector 130B, and may be disposed only on the opposite portion 140-2 which is not opposite to the reflector 130B. Thus, the second reflective layer 162A may reflect light, which otherwise would be directly emitted through the light emission surface LO from the first lens 140A rather than being reflected by the reflector 130B, so as to allow the light to be directed to the reflector 130B. Accordingly, a greater amount of light may be emitted by being reflected by the reflector 130B compared to the case where no second reflective layer 162A is provided, which may be advantageous for collimation.

In addition, the second reflective layer 162A may take the form of a film or a sheet attached to the upper surface of the first lens 140A, or a coating applied to the upper surface of the first lens 140A. To this end, when the first lens 140A is a semispherical shape, the second reflective layer 162A may have a constant radius of curvature corresponding to the radius of the semispherical first lens 140A.

In addition, the length L of the second reflective layer 162A may be determined based on the maximum viewing angle of the light directed from the first lens 140A to the light emission surface LO, other than the reflector 130B.

In addition, the reflector 130A of the light-emitting apparatus 100A illustrated in FIGS. 1 to 3 includes the body 130-1 and the reflective film 130-2, whereas the reflector 130B illustrated in FIGS. 6 to 8 may include the body 130-1 which serves as both the body 130-1 and the reflective film 130-2 illustrated in FIGS. 1 to 3. That is, the reflector 130B illustrated in FIGS. 6 to 8 may include only the body 130-1 formed of a reflective material.

As described above, the light-emitting apparatus 100B illustrated in FIGS. 6 to 8 is the same as the light-emitting apparatus 100A illustrated in FIGS. 1 to 3 except that the reflector 130B has a different structure and the light-emitting apparatus 100B further includes the second reflective layer 162A.

Figure 9:
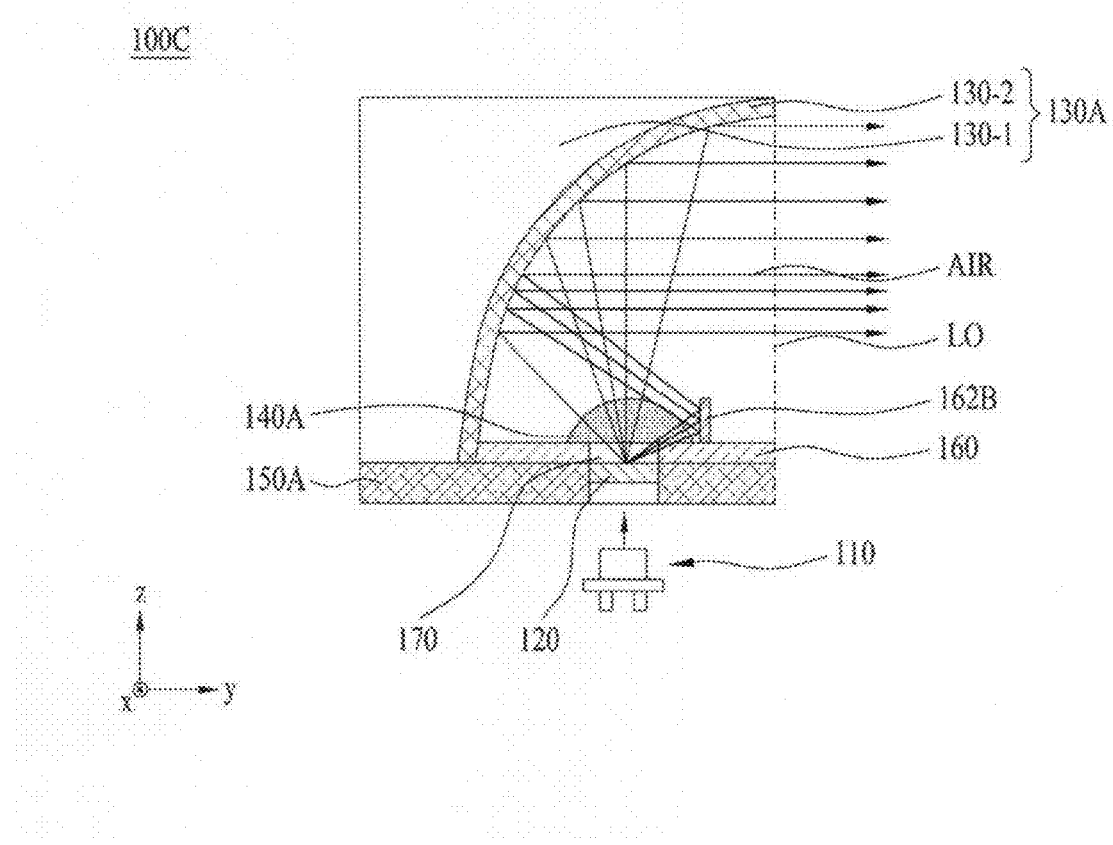
FIG. 9 is a sectional view of a light-emitting apparatus according to another embodiment.
Figure 10:
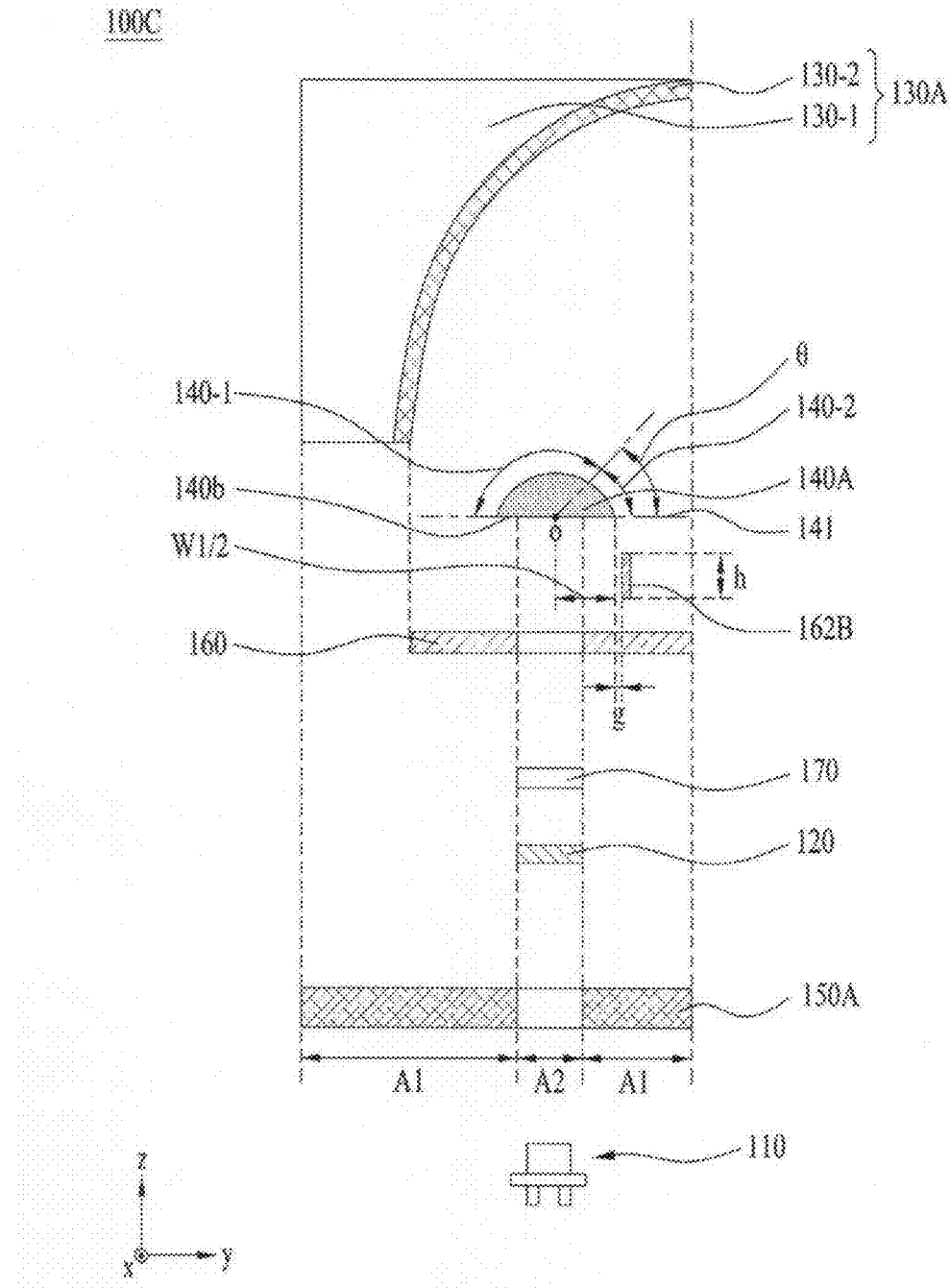
FIG. 10 is an exploded sectional view of the light-emitting apparatus illustrated in FIG. 9.

FIG. 9 is a sectional view of a light-emitting apparatus 100C according to another embodiment, and FIG. 10 is an exploded sectional view of the light-emitting apparatus 100C illustrated in FIG. 9.

The light-emitting apparatus 100C according to the present embodiment may include the light source 110, the wavelength converter 120, the reflector 130A, the first lens 140A, the base substrate 150A, the first and second reflective layers 160 and 162B, and the adhesive part 170.

The light source 110, the wavelength converter 120, the reflector 130A, the first lens 140A, the base substrate 150A, the first reflective layer 160, and the adhesive part 170 illustrated in FIGS. 9 and 10 respectively correspond to the light source 110, the wavelength converter 120, the reflector 130A, the first lens 140A, the base substrate 150A, the first reflective layer 160, and the adhesive part 170 illustrated in FIGS. 1 to 3, and thus the same parts are designated by the same reference numerals and a repeated description thereof will be omitted below.

Unlike the light-emitting apparatus 100A illustrated in FIGS. 2 and 3, the light-emitting apparatus 100C illustrated in FIGS. 9 and 10 may further include a second reflective layer 162B. Except for this the light-emitting apparatus 100C illustrated in FIGS. 9 and 10 is the same as the light-emitting apparatus 100A illustrated in FIGS. 2 and 3.

In addition, unlike the light-emitting apparatus 100B illustrated in FIGS. 6 to 8, in the light-emitting apparatus 100C illustrated in FIGS. 9 and 10, the second reflective layer 162B may be disposed to be spaced apart from the first lens 140A, and the reflector 130A may include the body 130-1 and the reflective film 130-2. Except for this, the light-emitting apparatus 100C illustrated in FIGS. 9 and 10 is the same as the light-emitting apparatus 100B illustrated in FIGS. 7 and 8.

The second reflective layer 162B, illustrated in FIGS. 9 and 10, is spaced apart from the first lens 140A by a given distance g in the horizontal direction (e.g. the y-axis) perpendicular to the optical axis (e.g., the z-axis). At this time, the second reflective layer 162B may have a given height h. Here, the height h may be represented by the following Equation 1.

$$h = \left(\frac{W1}{2} + g\right)\tan\theta \qquad \text{Equation 1}$$

Here, "W½" means half the first width W1 in the horizontal direction (e.g. the y-axis) from the center of the first lens 140A, and "θ" means the maximum emission angle of light, which may be directly emitted from the first lens 140A to the light emission surface LO, relative to an imaginary horizontal line 141 which extends in the horizontal direction from the bottom surface 140b of the first lens 140A. That is, light emitted from the upper surface of the first lens 140A at an angle greater than θ may be reflected by the reflector 130A, and light emitted at an angle of θ or less may be emitted through the light emission surface LO without being reflected by the reflector 130A.

Accordingly, because the second reflective layer 162B having the height H is disposed on the base substrate 150A as described above, light, which otherwise would be directly emitted from the first lens 140A through the light emission surface LO, may be reflected by the second reflective layer 162B and directed to the reflector 130A, which enables the light to be again used and may be advantageous for collimation.

In conclusion, as exemplarily illustrated in FIGS. 7 and 9, through the provision of the second reflective layer 162A or 162B, the light-emitting apparatus 100B or 100C may emit light suitable for use in applications that require collimation, for example, a vehicle lamp.

Figure 11:
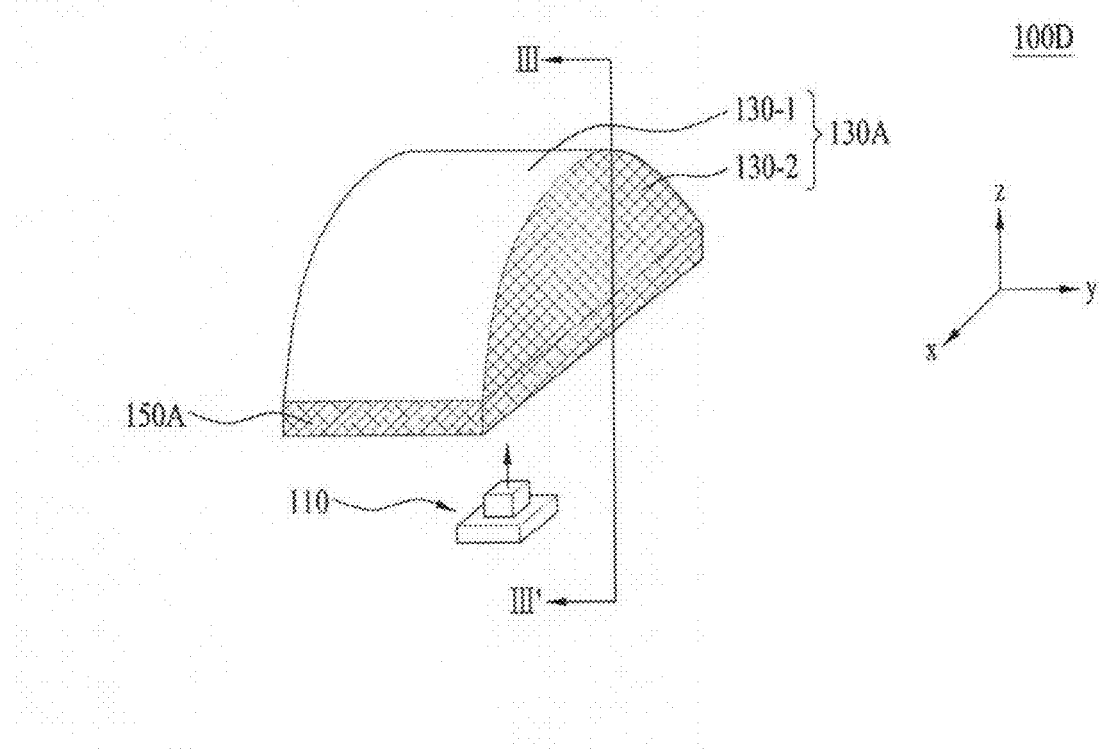
FIG. 11 is a perspective view of a light-emitting apparatus according to another embodiment.
Figure 12:
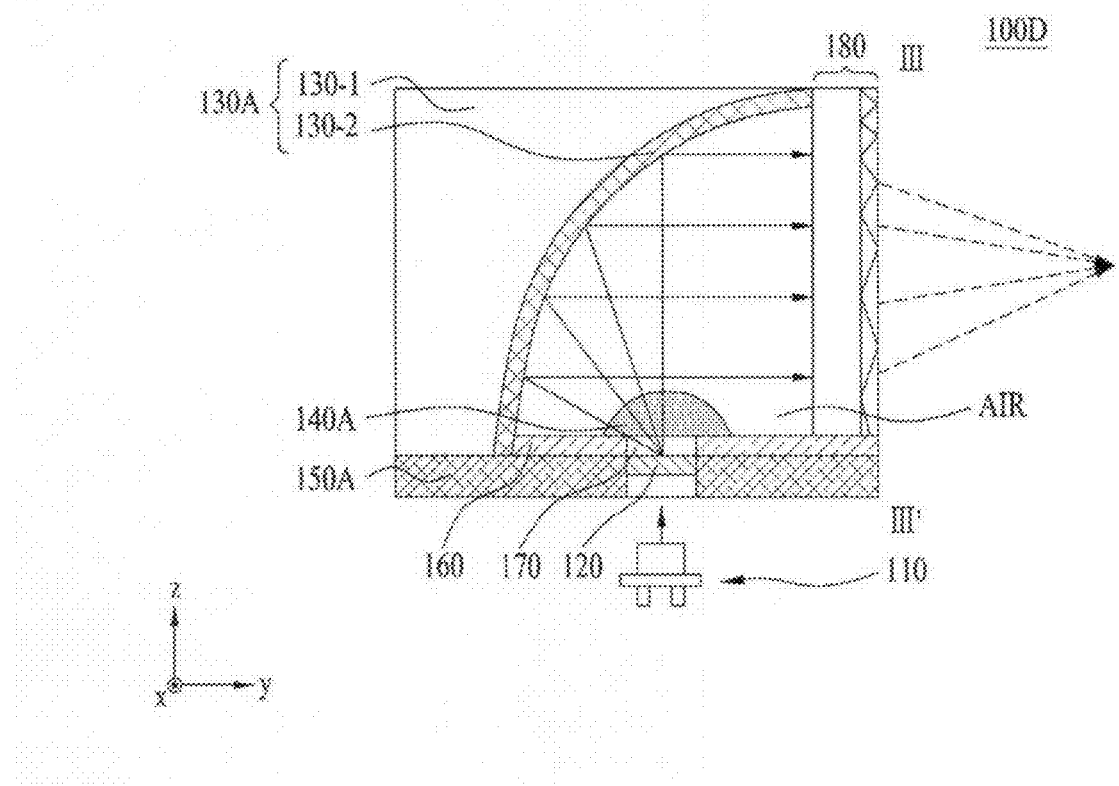
FIG. 12 is a sectional view taken along line III-III' of the light-emitting apparatus illustrated in FIG. 11.
Figure 13:
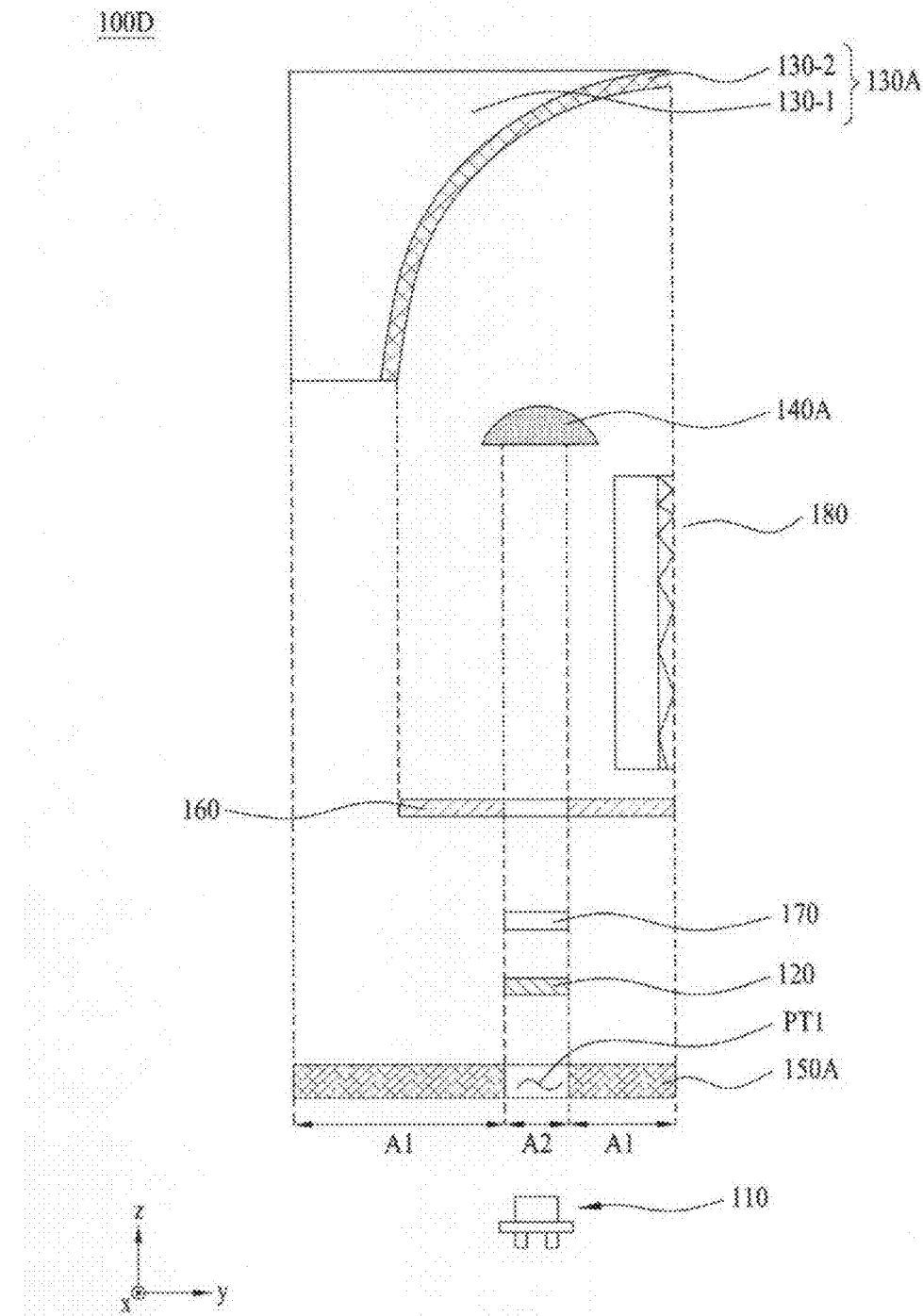
FIG. 13 is an exploded sectional view of the light-emitting apparatus illustrated in FIG. 12.

FIG. 11 is a perspective view of a light-emitting apparatus 100D according to another embodiment, FIG. 12 is a sectional view taken along line II-III' of the light-emitting apparatus 100D illustrated in FIG. 11, and FIG. 13 is an exploded sectional view of the light-emitting apparatus 100D illustrated in FIG. 12.

The light-emitting apparatus 100D according to another embodiment may include the light source 110, the wavelength converter 120, the reflector 130A, the first lens 140A, the base substrate 150A, the first reflective layer 160, the adhesive part 170, and a beam-forming part 180.

The light source 110, the wavelength converter 120, the reflector 130A, the first lens 140A, the base substrate 150A, the first reflective layer 160, and the adhesive part 170 illustrated in FIGS. 11 to 13 respectively correspond to the light source 110, the wavelength converter 120, the reflector 130A, the first lens 140A, the base substrate 150A, the first reflective layer 160, and the adhesive part 170 illustrated in FIGS. 1 to 3, and thus the same parts are designated by the same reference numerals and a repeated description thereof will be omitted below.

Unlike the light-emitting apparatus 100A illustrated in FIGS. 1 to 3, the light-emitting apparatus 100D illustrated in FIGS. 11 to 13 may further include the beam-forming part 180.

The beam-forming part 180 may be a sort of lens that may be disposed on the light emission surface LO, through which the light reflected by the reflector 130A is emitted. The beam-forming part 180 may include at least one of a Fresnel lens, a freeform lens, or a conic lens.

Alternatively, although not illustrated, instead of the beam-forming part 180, an anti-reflective (AR) film may further be disposed on the light emission surface LO on which the beam-forming part 180 is disposed.

In addition, although not illustrated, the beam-forming part 180 illustrated in FIGS. 11 to 13 may of course be provided in the light-emitting apparatus 100B illustrated in FIGS. 8 to 10 in the same manner as that illustrated in FIGS. 11 to 13.

The light, having passed through the lens 140A and having been reflected by the reflector 130A to thereby be emitted outward, may have various forms according to the shape of the lens 140A, the first index of refraction n1 of the wavelength converter 120, the second index of refraction n2 of the lens 140A, and the shape and size of the reflector 130A. In one example, as shown in FIG. 12, the beam-forming part 180 may form a single light beam, instead of collimating the light reflected by the reflector 130A.

The light-emitting apparatus 100D including the beam-forming part 180 may be used for a lighting apparatus such as the light-emitting apparatus 100D described above.

Figure 14:
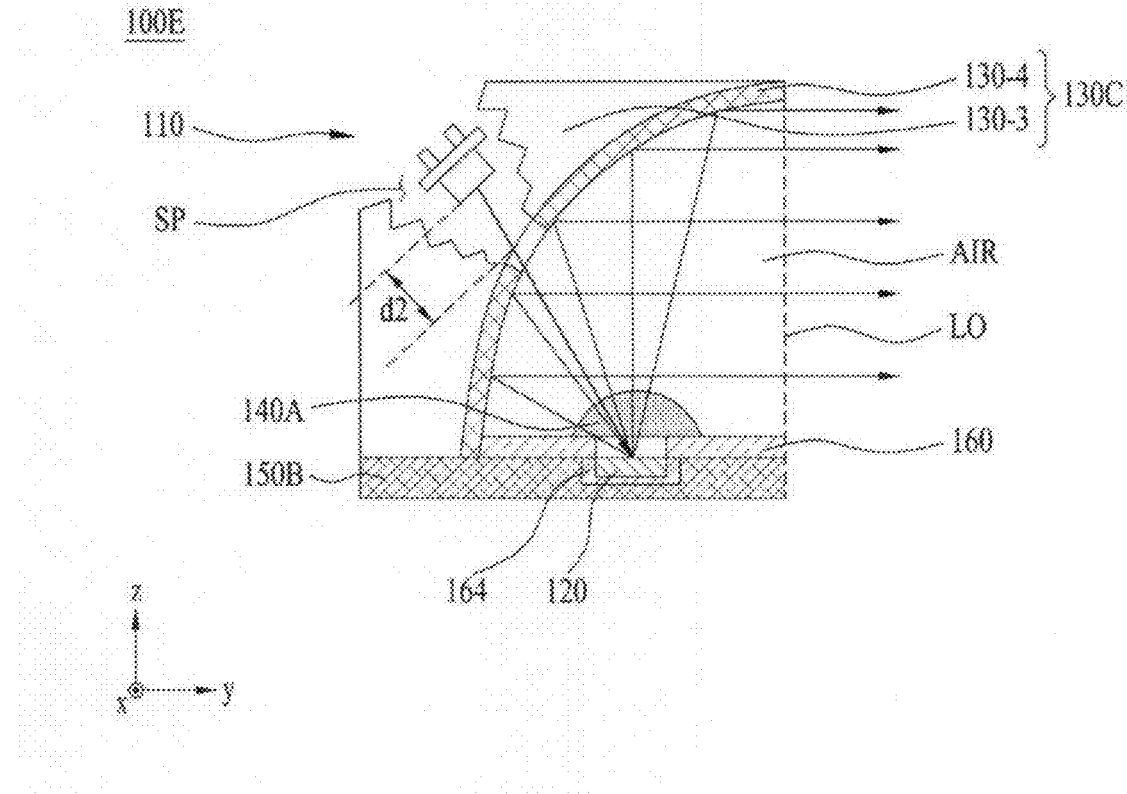
FIG. 14 is a sectional view of a light-emitting apparatus according to another embodiment.
Figure 15:
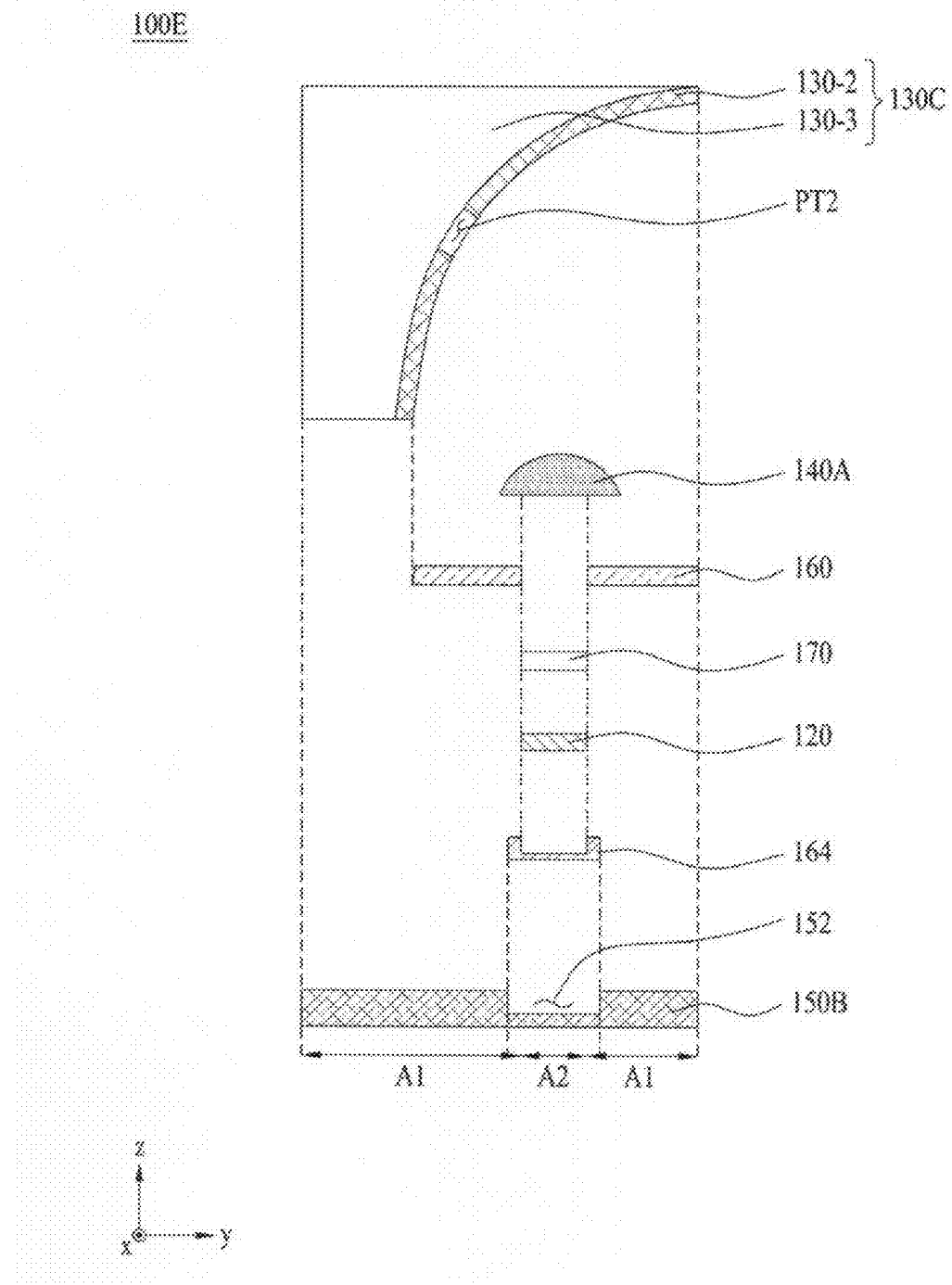
FIG. 15 is an exploded sectional view of the light-emitting apparatus illustrated in FIG. 14.

FIG. 14 is a sectional view of a light-emitting apparatus 100E according to another embodiment, and FIG. 15 is an exploded sectional view of the light-emitting apparatus 100E illustrated in FIG. 14.

The light-emitting apparatus 100E according to another embodiment may include the light source 110, the wavelength converter 120, the reflector 130C, the first lens 140A, the base substrate 150B, the first reflective layer 160, a third reflective layer 164, and the adhesive part 170.

The light source 110, the wavelength converter 120, the first lens 140A, the first reflective layer 160, and the adhesive part 170 illustrated in FIGS. 14 and 15 respectively correspond to the light source 110, the wavelength converter 120, the first lens 140A, the first reflective layer 160, and the adhesive part 170 illustrated in FIGS. 2 and 3, and the same parts are designated by the same reference numerals and thus a repeated description thereof will be omitted below.

Unless otherwise described in the light-emitting apparatus 100E illustrated in FIGS. 14 and 15, the above-described features of the light-emitting apparatus 100A illustrated in FIGS. 2 and 3 may of course be applied to the light-emitting apparatus 100E illustrated in FIGS. 14 and 15.

Unlike that the light source 110 of each of the above-described light-emitting apparatuses 100A to 100D is oriented toward the first through-hole PT1 of the base substrate 150A, the light source 110 of the light-emitting apparatus 100E shown in FIGS. 14 and 15 may be oriented toward the reflector 130C (or the second through-hole PT2).

In addition, the light source 110 may be disposed to be embedded in the reflector 130C.

In addition, the light source 110 may be disposed to be spaced apart from the second through-hole PT2 of the reflector 130C by a second distance d2. For the same reason that the light source 110 illustrated in FIGS. 1 to 3 is spaced apart from the first through-hole PT1 by the first distance d1, the light source 110 may be spaced apart from the second through-hole PT2 by the second distance d2 in order to prevent heat generated from the light source 110 from having an effect on the reflector 130C. For example, although the second distance d2 may be 10 μm or more, the embodiment is not limited thereto.

Meanwhile, like the reflector 130A of the light-emitting apparatus 100A illustrated in FIGS. 1 to 3, the reflector 130C may include a body 130-3 and a reflective film 130-4. The body 130-3 may have a space SP in which the light source 110 is embedded as illustrated in FIG. 14. Alternatively, unlike the illustration of FIG. 14, in order to allow the light emitted from the light source 110 to be introduced into the second through-hole PT2 when the light source 110 is not embedded in the reflector 130C, the reflector 130C may define an optical path therein.

In addition, unlike the reflective film 130-2 of the reflector 130A illustrated in FIGS. 1 to 3, the reflective film 130-4 of the reflector 130C illustrated in FIGS. 14 and 15 may include the second through-hole PT2. The second through-hole PT2 corresponds to an inlet into which the light emitted from the light source 110 is introduced.

In the same manner as the first through-hole PT1, although laser diodes having a narrower viewing angle than light-emitting diodes may be advantageous in terms of the introduction of light into the second through-hole PT2, the embodiment is not limited thereto. That is, in the case where an optical system (not illustrated) capable of reducing the viewing angle is located between the light source 110, i.e. the light-emitting diodes and the second through-hole PT2, the optical system may reduce the viewing angle of light emitted from the light-emitting diodes so as to introduce the light into the second through-hole PT2.

In addition, the base substrate 150A of the light-emitting apparatus 100A illustrated in FIGS. 1 to 3 has the first through-hole PT1, whereas the base substrate 150B of the light-emitting apparatus 100E may have a recess 152 instead of the first through-hole PT1.

The recess 152 may be formed in the second area A2 of the base substrate 150B, and the wavelength converter 120 may be located in the recess 152.

In addition, the third reflective layer 164 may be disposed in the recess 152 between the wavelength converter 120 and the base substrate 150B. The light, which is introduced into the wavelength converter 120 by way of the first lens 140A through the second through-hole PT2, may pass through the wavelength converter 120 so as to be absorbed by the base substrate 150B, or may be emitted through the bottom surface of the base substrate 150B. To prevent this, the third reflective layer 164 is disposed. The third reflective layer 164 reflects the light having passed through the wavelength converter 120 so as to direct the light to the first lens 140A. Thereby, the light extraction efficiency of the light-emitting apparatus 100E may be improved. The third reflective layer 164 may take the form of a film, or a coating attached to the wavelength converter 120 or the base substrate 150B.

When the reflectance of the third reflective layer 164 is below 60%, the third reflective layer 164 cannot properly perform reflection. Thus, although the reflectance of the third reflective layer 164 may be within a range from 60% to 100%, the embodiment is not limited thereto.

In some cases, the third reflective layer 164 may be omitted.

In the light-emitting apparatus 100E illustrated in FIGS. 14 and 15, of course, the second reflective layer 162A or 162B may further be provided in the manner illustrated in FIGS. 6 to 10, and the beam-forming part 180 may further be provided in the manner illustrated in FIGS. 11 to 13.

There may be a plurality of light sources 110. For example, in the case where the light-emitting apparatuses 100A to 100E described above are used for a vehicle lamp, the light sources 110 may be plural in number. As such, the number of light sources 110 may vary according to the field in which the light-emitting apparatuses 100A to 100E of the embodiments are applied.

In addition, although the light-emitting apparatuses 100A to 100E described above are illustrated as including a single light source 110, a single wavelength converter 120, and a single first lens 140A, the embodiments are not limited thereto. That is, in another embodiment, a plurality of light sources 110, a plurality of wavelength converters 120, and a plurality of first lenses 140A may be arranged in a one to one ratio, and a plurality of light sources 110, a single wavelength converter 120, and a single first lens 140A may be arranged.

Hereinafter, light-emitting apparatuses 100F to 100I according to another embodiments, which include a plurality of light sources 110 and various optical devices, will be described with reference to the accompanying drawings. For convenience of description, although three light sources 110 will be described, two light sources 110 may be provided, or four or more light sources 110 may be provided.

FIGS. 16 to 19 are sectional views of light-emitting apparatuses 100F to 100I according to another embodiments.

Figure 16:
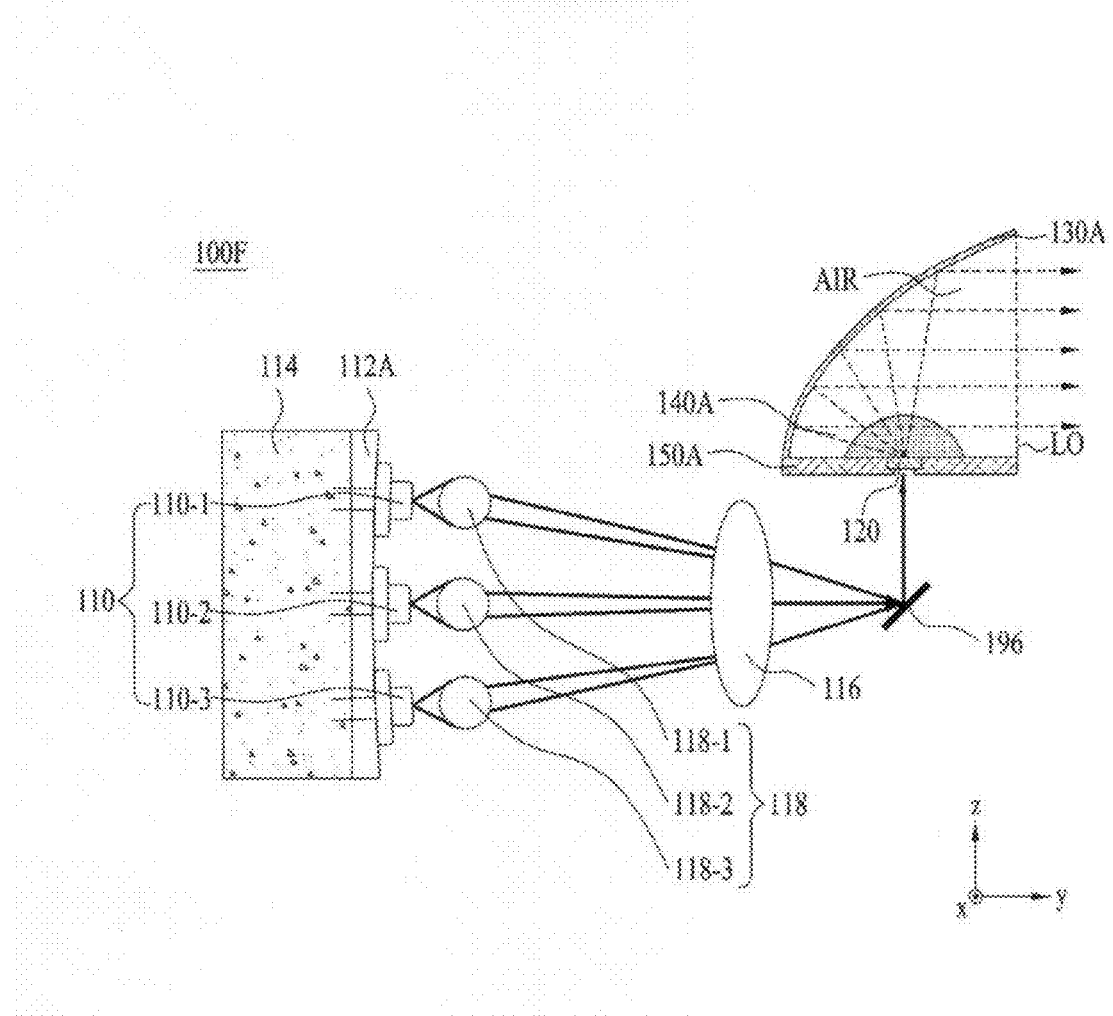
FIG. 16 is a sectional view of a light-emitting apparatus according to another embodiment.
Figure 17:
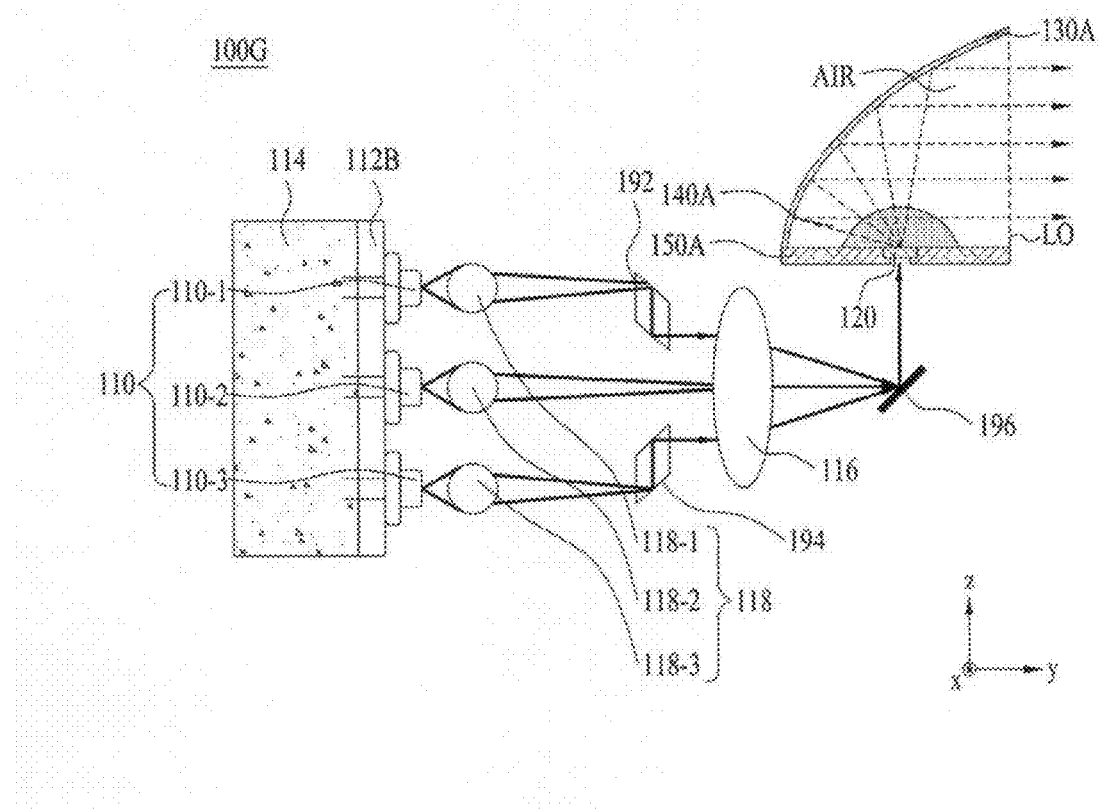
FIG. 17 is a sectional view of a light-emitting apparatus according to another embodiment.
Figure 18:
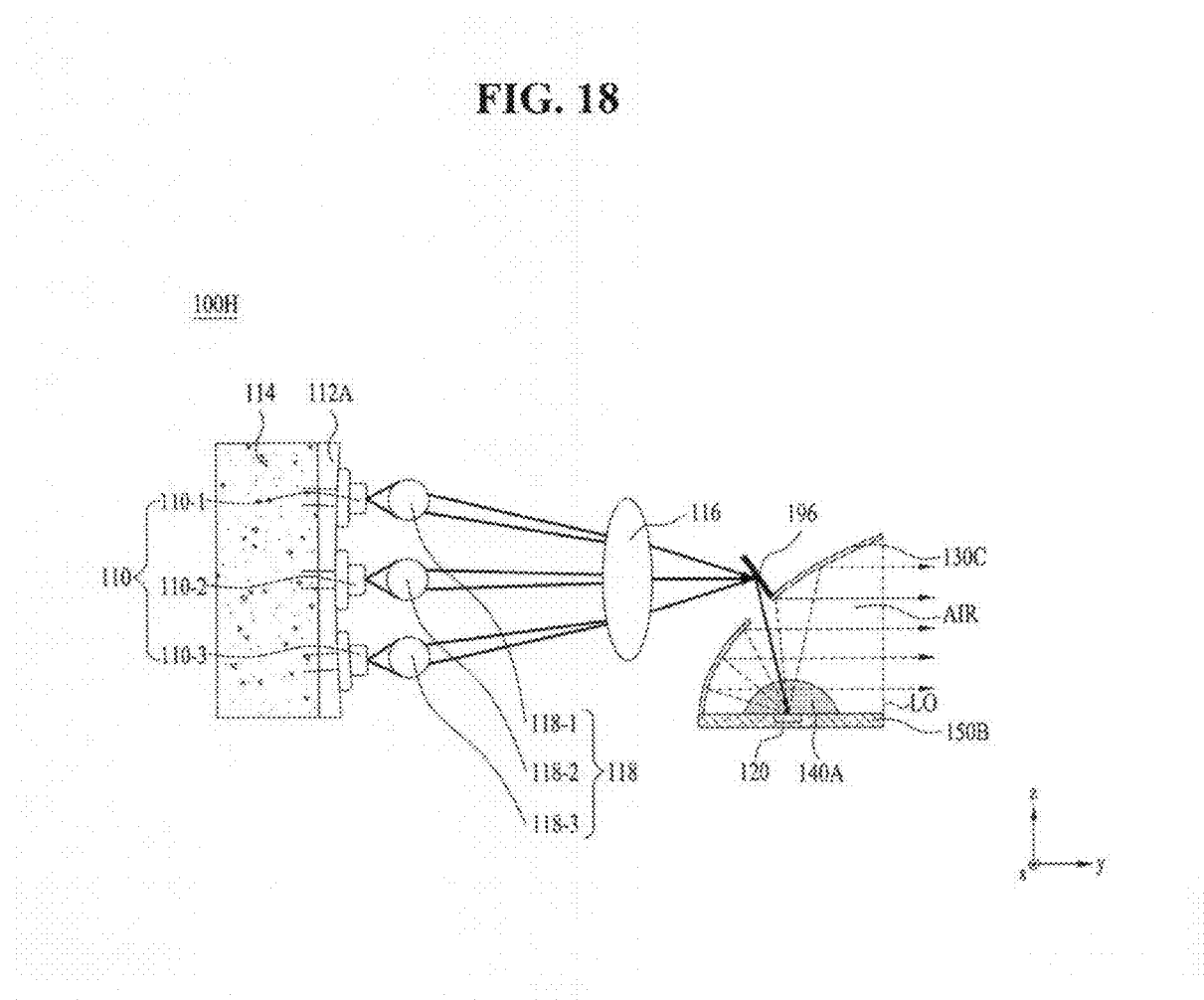
FIG. 18 is a sectional view of a light-emitting apparatus according to another embodiment.
Figure 19:
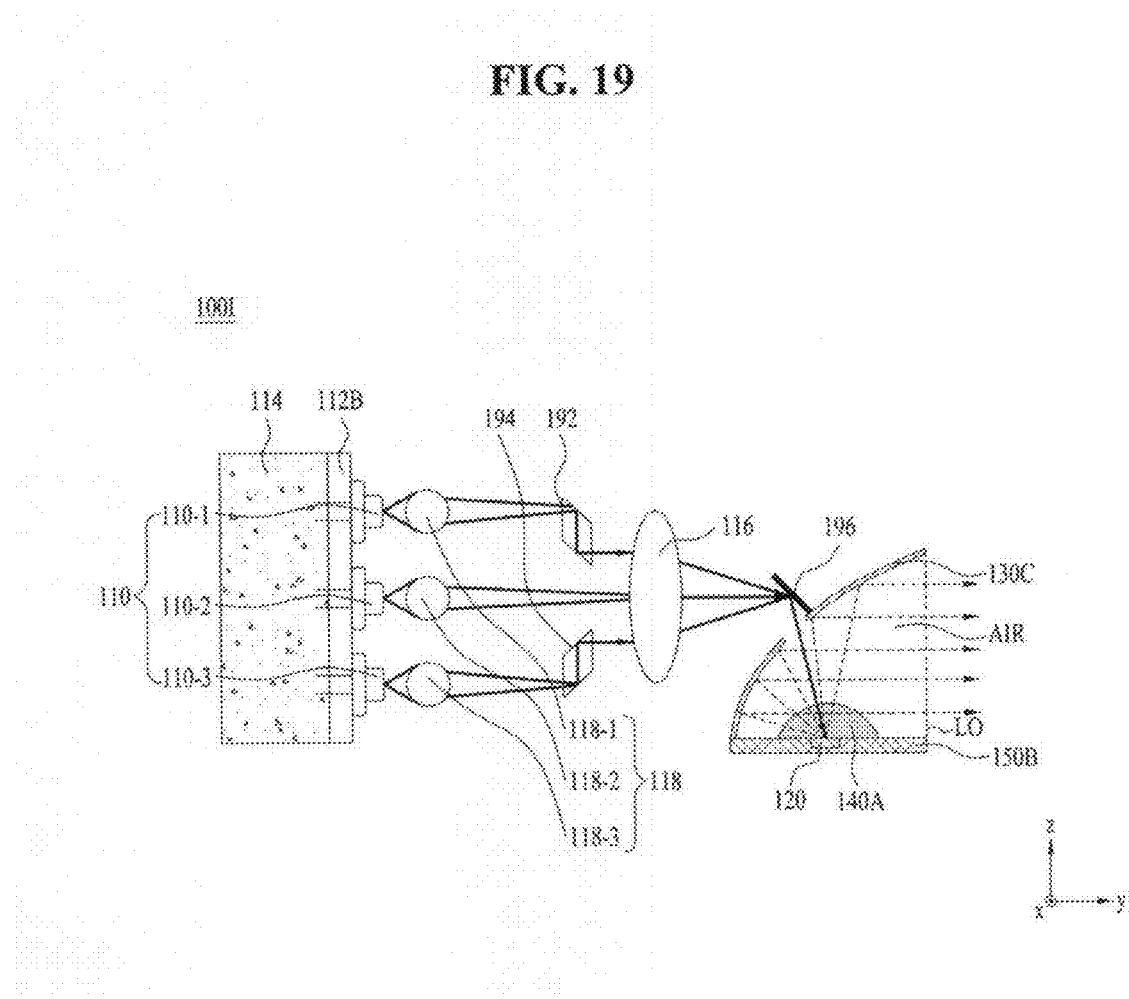
FIG. 19 is a sectional view of a light-emitting apparatus according to another embodiment.

The light-emitting apparatuses 100F and 100G illustrated in FIGS. 16 and 17 include the light-emitting apparatus 100A illustrated in FIG. 2, and the light-emitting apparatuses 100H and 100I illustrated in FIGS. 18 and 19 include the light-emitting apparatus 100E illustrated in FIG. 14, and thus the same parts are designated by the same reference numerals and a repeated description thereof will be omitted.

For convenience of description, although the first reflective layer 160, the adhesive part 170, and the body 130-1 of the reflector 130A illustrated in FIGS. 2 and 3 are not illustrated in the light-emitting apparatus 100A included in the light-emitting apparatuses 100F and 100G illustrated in FIGS. 16 and 17. In addition, the first and third reflective layers 160 and 164, the adhesive part 170, and the body 130-3 of the reflector 130C illustrated in FIGS. 14 and 15 are not illustrated in the light-emitting apparatus 100E included in the light-emitting apparatuses 100H and 100I illustrated in FIGS. 18 and 19.

In addition, the light-emitting apparatuses 100F and 100G illustrated in FIGS. 16 and 17 may include the light-emitting apparatus 100B, 100C or 100D illustrated in FIG. 7, 9 or 12, instead of the light-emitting apparatus 100A illustrated in FIG. 2.

Each of the light-emitting apparatuses 100F and 100G illustrated in FIGS. 16 and 17 may include the light-emitting apparatus 100A illustrated in FIGS. 1 to 3, a circuit board 112A or 112B, a radiator 114, a second-first lens 116, a second-second lens 118, and a first mirror 196. In addition, each of the light-emitting apparatuses 100H and 100I illustrated in FIGS. 18 and 19 may include the light-emitting apparatus 100E illustrated in FIG. 14, the circuit board 112A or 112B, the radiator 114, the second-first lens 116, the second-second lens 118, and the first mirror 196.

In FIGS. 16 to 19, the description related to the light-emitting apparatuses 100A and 100E is the same as given above and thus is omitted. However, each of the light-emitting apparatuses 100F, 100G, 100I and 100I illustrated in FIGS. 16 to 19 include a plurality of light sources 100; 110-1, 110-2 and 110-3, and the light sources 110; 110-1, 110-2 and 110-3 are mounted on the circuit board 112A or 112B.

In addition, although the radiator 114 may be attached to the rear surface of the circuit board 112A or 112B so as to outwardly discharge heat generated in the light-emitting apparatuses 100F to 100I, the embodiments are not limited as to the position of the radiator 114. In another embodiment, the radiator 114 may be attached to the rear surface of the base substrate 150A or 150B, in addition to the circuit board 112A or 112B. In another embodiment, the radiator 114 may be attached only to the rear surface of the base substrate 150A or 150B-1 without being attached to the rear surface of the circuit board 112A or 112B. Alternatively, in some cases, the radiator 114 may be omitted, the radiator 114 may be located on the side surface as well as the rear surface of the circuit board 112A or 112B or the base substrate 150A or 150B-1, or the radiator 114 may be located only on the side surface and not on the rear surface.

Although the radiator 114 may be formed of aluminum, the radiator 114 may be embodied as, for example, a Thermal Electric Cooler (TEC) in order to achieve higher radiation efficiency. However, the embodiment is not limited as to the position or the constituent material of the radiator 114.

In addition, at least one first lens 116 and/or 118 may focus the light emitted from the light sources 110 so as to emit the light through the first or second through-hole PT1 or PT2.

For example, at least one second lens may include the second-first lens 116 and the second-second lens 118. The second-second lens 118 may include three second-second lenses 118-1, 118-2 and 118-3 which are located respectively between the respective light sources 110-1, 110-2 and 110-3 and the second-first lens 116. That is, the second-second lenses 118 may be provided in the same number as the number of the light sources 110. The second-second lenses 118; 118-1, 118-2 and 118-3 serve to focus or collimate the light emitted from the light sources 110; 110-1, 110-2 and 110-3. Thus, when the light-emitting apparatus according to any one of the embodiments is applied to a headlight for a vehicle or a flashlight, light may reach very far in a straight line. According to the application, the second-second lenses 118; 118-1, 118-2 and 118-3 may be omitted. That is, when the light emitting device is applied to a traffic light, in order to allow the light emitted from the light-emitting apparatus to spread rather than traveling straight, the second-second lenses 118; 118-1, 118-2 and 118-3 may be omitted.

The second-first lens 116 is located between the second-second lens 118 and the first or second through-hole PT1 or PT2. When the second-second lens 118 is omitted, the second-first lens 116 may be located between the light sources 110; 110-1, 110-2 and 110-3 and the first or second through-hole PT1 or PT2. The second-first lens 116 may be a fθ lens. In the case of a general lens, when the position of a light source is changed, the position on which the light that is generated from the light source and passes through a lens is focused is changed. However, in the case of the fθ lens, even if the position of the light source is changed, the position on which the light having passed through the lens is focused is not changed. Accordingly, the second-first lens 116 may collect the light emitted from the light sources 110-1, 110-2 and 110-3 and transmit the light the first or second through-hole PT1 or PT2 via the first mirror 196.

The first mirror 196 is located between the second-first lens 116 and the first or second through-hole PT1 or PT2 and serves to reflect the light focused by the second-first lens 116 so as to introduce the light to the first or second through-hole PT1 or PT2.

Meanwhile, the surface of the circuit board 112A or 112B, on which the light sources 110; 110-1, 110-2 and 110-3 are mounted, may be a curved surface or a spherical surface as illustrated in FIG. 16 or FIG. 18, or may be a flat surface as illustrated in FIG. 17 or FIG. 19.

Various methods may be used in order to collect the light from the light sources 110. For example, as illustrated in FIGS. 16 and 18, when the surface of the circuit board 112A, on which the light sources 110; 110-1, 110-2 and 110-3 are mounted, is a curved surface or a spherical surface, the light from the light sources 110 may be collected together. When the mounting surface of the circuit board 112A is a spherical surface, the radius of the sphere corresponding to the spherical surface may correspond to the focal distance of the second-second lens 118, which serves as a collimation lens.

However, when the surface of the circuit board 112B, on which the light sources 110; 110-1, 110-2 and 110-3 are mounted, is a flat surface illustrated in FIG. 17 or FIG. 19, in order to collect the light from the light sources together, each of the light-emitting apparatuses 100G and 100I may further include prisms 192 and 194 (or second mirrors or a dichroic coating layer) disposed between the light sources 110 and at least one the second lens, that is, between the second-second lenses 118 and the second-first lens 116. Here, the dichroic coating layer may serve to reflect or transmit light in a specific wavelength band.

In addition, optical fibers may be used to collect the light from the light sources 110 together so as to introduce the collected light into the first or second through-hole PT1 or PT2.

Meanwhile, the light-emitting apparatuses according to the above-described embodiments may be applied to various fields. For example, the light-emitting apparatus may be applied in a wide variety of fields such as various lamps for vehicles (e.g. a low beam, a high beam, a tail lamp, a sidelight, a turn signal, a Day Running Light (DRL), and a fog lamp), a flash light, a traffic light, or various other lightings.

In conclusion, the light-emitting apparatuses 100A to 100I according to the above-described embodiments convert the wavelength of light excited by the light source 110 using the wavelength converter 120 so as to have a desired color and color temperature, and then allow the light to meet the air layer AIR after the light first passes through the lens 140A, in order the light not to directly meet the air layer AIR, thereafter direct the light to the reflector 130A to 130C.

Generally, light may undergo total internal reflection due to the difference in the index of refraction between materials when the light travels from a material having a high index of refraction to a material having a low index of refraction. When the difference in the index of refraction between the materials is great, the probability of total internal reflection increases so that the efficiency with which the light is extracted outward may be reduced. In consideration of this, in the case of the light-emitting apparatuses 100A to 100I according to the embodiments, the light, reflected by or transmitted through the wavelength converter 120, is directed to travel to the reflector 130A to 130C through the lens 140A, prior to entering the air layer. As such, the light extraction efficiency may be enhanced, and the distribution of light to be emitted, i.e. the illuminance distribution may be adjusted in a desired manner.

In addition, since the lens 140A is located between the wavelength converter 120 and the reflector 130A to 130C, the illuminance uniformity and the intensity of light emitted from the light source 110 on a per angle basis may be improved.

In addition, the lens 140A formed of a high thermal conductivity material enables the efficient dissipation of heat generated from the wavelength converter 120, which may result in excellent heat radiation effects.

The size, shape, and structure of the light-emitting apparatuses 100A to 100I according to the above-described embodiments may be determined in various ways according to the field in which the light-emitting apparatuses 100A to 100I are applied. For example, when the light-emitting apparatuses 100A to 100I are applied to a vehicle, the size or shape of the light-emitting apparatuses 100A to 100I may be modified in various ways based on the roles of the respective lamps mounted in the vehicle, so as to emit a desired quantity of light having desired color coordinates Cx and Cy and color temperature CCT. For example, the light-emitting apparatuses 100A to 100I may emit red light for application to a tail lamp of a vehicle, may emit yellow light for application to a turn signal of a vehicle, or may emit white or yellow light for application to a low beam.

Figure 20:
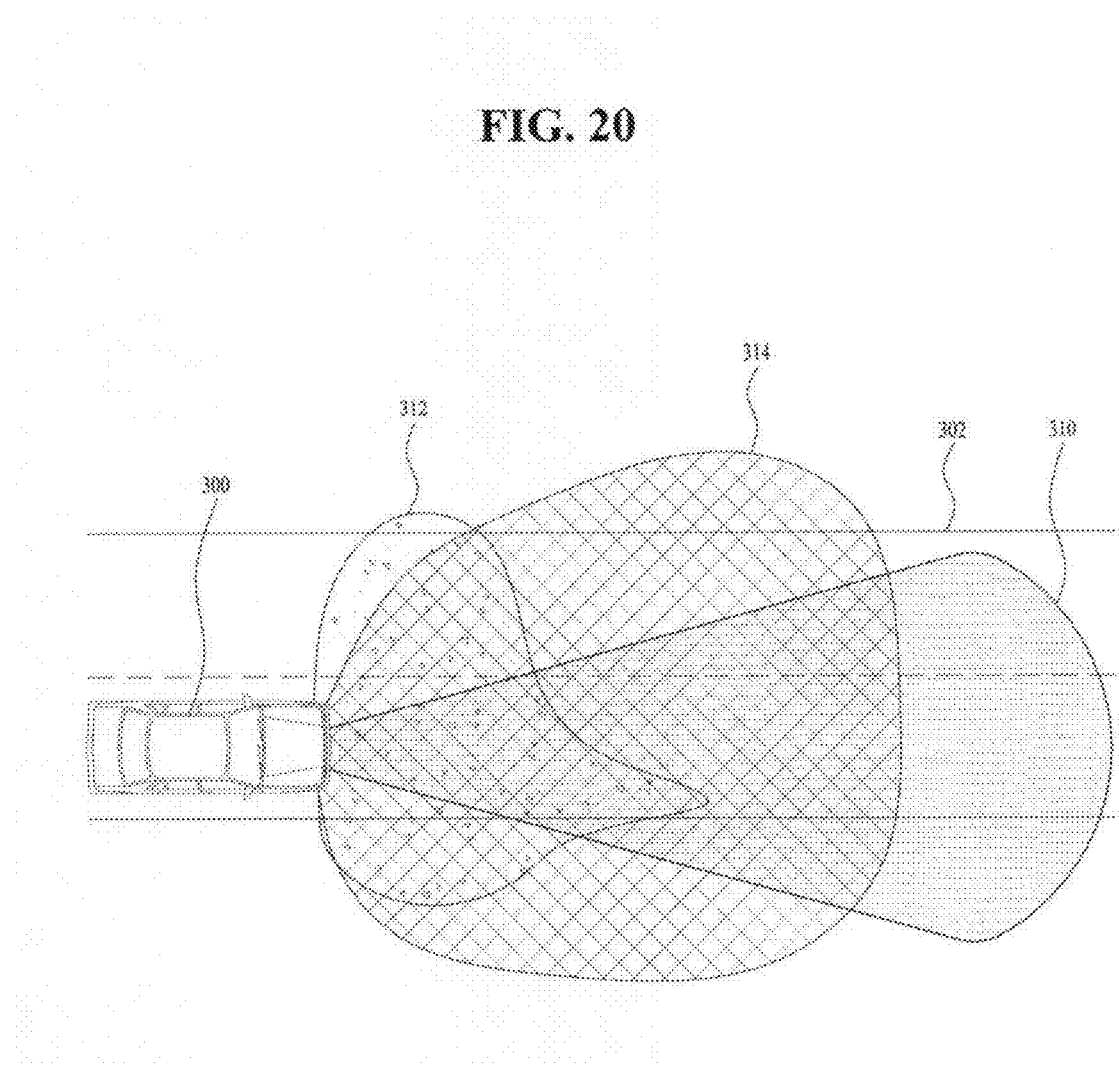
FIG. 20 is a view illustrating the illuminance distribution of light when the light-emitting apparatus according to an embodiment is applied to a headlight for a vehicle.

FIG. 20 is a view illustrating the illuminance distribution of light in the case where any one of the light-emitting apparatuses 100A to 100I according to the embodiments is applied to a headlight for a vehicle.

Referring to FIG. 20, in the state in which a vehicle 300 travels on a road 302, the light-emitting apparatuses 100A to 100I according to the embodiments, which have high light extraction efficiency, may emit light that travels straight so as to achieve light distribution 310 that allows the light to reach very far, for example, a distance of 600 m from the vehicle 300. In this case, the light-emitting apparatuses 100A to 100I according to the embodiments may be applied to assist a high beam of a vehicle in connection with an Advanced Driving Assistance System (ADAS) by realizing spot beams for remote target lighting. However, the embodiments are not limited thereto, and the light-emitting apparatuses 100A to 100I according to the embodiments may be used to emit light having short-distance light distribution 312 or 314. For example, with using the light-emitting apparatuses 100A to 100I according to the embodiments, light may be collected to be emitted very far in a straight direction, or may spread to be emitted to a short distance according to the shape of the reflector 130A to 130C or the kind of lens, which may vary widely.

As is apparent from the above description, light-emitting apparatuses according to the embodiments may achieve excellent light extraction efficiency, may adjust the distribution of light to be emitted, i.e. the illuminance distribution in a desired manner, may improve the illumination uniformity and intensity of light on a per angle basis, and may exhibit excellent heat radiation effects.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light-emitting apparatus comprising:
   at least one light source;
   a wavelength converter configured to convert a wavelength of light emitted from the light source;
   a first lens configured to face a light emission surface of the wavelength converter;
   a rounded reflector spaced apart from the first lens, the reflector being configured to reflect light emitted from the first lens; and
   a base substrate configured to support the reflector, the wavelength converter and the first lens being disposed on the base substrate.

2. The apparatus according to claim 1, wherein at least a portion of the first lens is disposed to face the reflector with an air layer interposed therebetween.

3. The apparatus according to claim 1, wherein the base substrate comprises:
   a first area; and
   a second area adjacent to the first area, the wavelength converter being disposed in the second area.

4. The apparatus according to claim 3, further comprising a first reflective layer disposed in the first area of the base substrate.

5. The apparatus according to claim 3, wherein the second area of the base substrate includes a first through-hole for introduction of the light emitted from the light source, and the wavelength converter is disposed in the first through-hole.

6. The apparatus according to claim 3, wherein the reflector includes a second through-hole for introduction of the light emitted from the light source.

7. The apparatus according to claim 6, wherein the second area of the base substrate includes a recess for arrangement of the wavelength converter.

8. The apparatus according to claim 1, further comprising a second reflective layer disposed to face a portion of an upper surface of the first lens, the portion being not opposite to the reflector.

9. The apparatus according to claim 8, wherein the second reflective layer is disposed on the portion of the upper surface of the first lens.

10. The apparatus according to claim 9, wherein the second reflective layer is a film or a sheet attached to, or a coating applied to the upper surface of the first lens.

11. The apparatus according to claim 8, wherein the second reflective layer is spaced apart from the first lens.

12. The apparatus according to claim 1, further comprising a beam-forming part disposed on a portion from which the light reflected by the reflector is emitted.

13. The apparatus according to claim 1, further comprising an anti-reflective film disposed on a portion from which the light reflected by the reflector is emitted.

14. The apparatus according to claim 1, wherein the light source, the wavelength converter, and the first lens are arranged along an optical axis.

15. The apparatus according to claim 1, wherein the wavelength converter has a first index of refraction and the first lens has a second index of refraction, and a ratio of the second index of refraction to the first index of refraction is 0.6 or more.

16. The apparatus according to claim 1, wherein the first lens has a semispherical shape.

17. The apparatus according to claim 1, wherein the wavelength converter has a first width and a bottom surface of the first lens has a first width in a direction perpendicular to an optical axis, and a ratio of the first width of the wavelength converter to the first width of the bottom surface of the first lens is within a range from 0.001 to 1.

18. The apparatus according to claim 1, wherein the first lens comprises at least one of $Al_2O_3$ single crystals and $Al_2O_3$, or $SiO_2$ glass.

19. The apparatus according to claim 1, wherein the first lens has a thermal conductivity coefficient within a range from 1 W/mK to 50 W/mK, and a reference temperature is within a range from 20K to 400K.

* * * * *